(12) United States Patent
Xiao et al.

(10) Patent No.: US 12,167,583 B2
(45) Date of Patent: Dec. 10, 2024

(54) METHOD OF FORMING SEMICONDUCTOR DEVICE WITH INCREASED UNIT DENSITY

(71) Applicant: TAIWAN SEMICONDUCTOR MANUFACTURING CO., LTD., Hsinchu (TW)

(72) Inventors: You-Cheng Xiao, Taichung County (TW); Jhih-Siang Hu, New Taipei (TW); Ru-Yu Wang, New Taipei (TW); Jung-Hsuan Chen, Hsinchu (TW); Ting-Wei Chiang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/064,777

(22) Filed: Dec. 12, 2022

(65) Prior Publication Data

US 2023/0111939 A1    Apr. 13, 2023

Related U.S. Application Data

(63) Continuation of application No. 17/035,438, filed on Sep. 28, 2020, now Pat. No. 11,552,085.

(51) Int. Cl.
*H10B 10/00* (2023.01)
*H01L 23/528* (2006.01)

(52) U.S. Cl.
CPC ......... *H10B 10/18* (2023.02); *H01L 23/5286* (2013.01); *H10B 10/12* (2023.02)

(58) Field of Classification Search
CPC ..... H10B 10/18; H10B 10/12; H01L 23/5286; H01L 27/0207

USPC .......................................................... 438/212
See application file for complete search history.

(56) References Cited

U.S. PATENT DOCUMENTS

| | | | |
|---|---|---|---|
| 8,039,904 B2 | 10/2011 | Kakoschke et al. | |
| 9,123,659 B1 | 9/2015 | Fu | |
| 9,735,287 B2 | 8/2017 | Zhu | |
| 2010/0088659 A1 | 4/2010 | Frederick | |
| 2011/0084312 A1* | 4/2011 | Quandt | H01L 27/0207 257/E27.105 |
| 2014/0131813 A1 | 5/2014 | Liaw | |
| 2015/0318181 A1 | 11/2015 | Cantone | |

(Continued)

FOREIGN PATENT DOCUMENTS

| | | |
|---|---|---|
| DE | 10 2019 135 843 A1 | 8/2020 |
| KR | 20140062404 A | 5/2014 |

(Continued)

*Primary Examiner* — Duy T Nguyen
(74) *Attorney, Agent, or Firm* — Maschoff Brennan

(57) ABSTRACT

A method includes: abutting a first logic cell having a first cell height to a first memory cell having the first cell height; forming a first conductive rail and a second conductive rail at opposite sides of the first memory cell, respectively; forming a plurality of first conductive rails between the first conductive rail and the second conductive rail; forming a third conductive rail and a fourth conductive rail at opposite sides of the first logic cell, respectively; and forming a plurality of second conductive rails between the third conductive rail and the fourth conductive rail. An amount of the plurality of second conductive rails is larger than an amount of the plurality of first conductive rails.

20 Claims, 12 Drawing Sheets

(56) References Cited

U.S. PATENT DOCUMENTS

| | | |
|---|---|---|
| 2015/0370951 A1 | 12/2015 | Kawa et al. |
| 2016/0013197 A1* | 1/2016 | Liu .................. H01L 29/42344 |
| | | 438/593 |
| 2016/0155741 A1* | 6/2016 | Yoo .................... H01L 27/0207 |
| | | 257/369 |
| 2016/0190138 A1* | 6/2016 | Shimbo .............. H01L 27/0629 |
| | | 257/369 |
| 2017/0053917 A1 | 2/2017 | Azmat et al. |
| 2017/0062421 A1 | 3/2017 | Cosemans et al. |
| 2017/0243955 A1 | 8/2017 | Shinohara |
| 2017/0287909 A1 | 10/2017 | Oh et al. |
| 2017/0317065 A1* | 11/2017 | Hirose ................ H01L 23/5286 |
| 2017/0338215 A1 | 11/2017 | Song et al. |
| 2017/0371995 A1 | 12/2017 | Correale, Jr. et al. |
| 2017/0373090 A1* | 12/2017 | Correale, Jr. ... H01L 21/823807 |
| 2018/0342462 A1* | 11/2018 | Kuchanuri ............ G06F 30/398 |
| 2018/0366583 A1* | 12/2018 | Kim ...................... H10B 10/12 |
| 2019/0164962 A1* | 5/2019 | Sio ...................... H01L 27/0924 |
| 2019/0363084 A1 | 11/2019 | Jo |
| 2020/0006335 A1 | 1/2020 | Zhuang et al. |
| 2020/0106441 A1 | 4/2020 | Liaw |
| 2020/0134122 A1 | 4/2020 | Huang et al. |
| 2020/0279069 A1* | 9/2020 | Kumar .................... H01L 23/50 |

FOREIGN PATENT DOCUMENTS

| | | |
|---|---|---|
| KR | 20170023358 A | 3/2017 |
| KR | 20190020682 A | 3/2019 |
| KR | 20200002010 A | 1/2020 |
| KR | 20200037082 A | 4/2020 |
| KR | 20200050425 A | 5/2020 |

* cited by examiner

METHOD OF FORMING SEMICONDUCTOR DEVICE WITH INCREASED UNIT DENSITY

CROSS-REFERENCE TO RELATED APPLICATION(S)

This application is a continuation application of U.S. application Ser. No. 17/035,438, filed on Sep. 28, 2020, now U.S. Pat. No. 11,552,085, issued Jan. 10, 2023, which is herein incorporated by reference.

BACKGROUND

Static random access memory (SRAM), including bit cells and peripheral cells, are frequently implemented by a semiconductor device. One way to represent the semiconductor device is with a plan view diagram referred to as a layout diagram with grids. The layout diagram is generated in a context of design rules. For example, for the peripheral cells in the layout diagram, an arrangement of each of fin-shaped active regions is restricted to a corresponding cell height, and it also constrains a density of active regions and an area scaling of the layout diagram.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
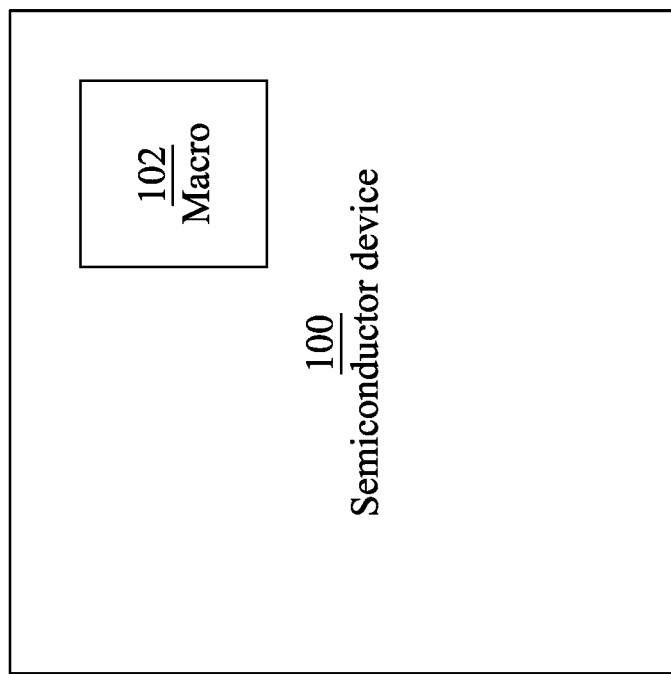
FIG. 1 is a simplified block diagram of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference now made to FIG. 1. FIG. 1 is a simplified block diagram of a semiconductor device 100, in accordance with some embodiments of the present disclosure. The semiconductor device 100 includes a circuit macro (hereinafter, macro) 102. In some embodiments, the macro 102 is a static random access memory (SRAM) macro. In some other embodiments, the macro 102 is a macro other than the SRAM macro.

In some embodiments, the macro 102 includes memory cells (not shown in FIG. 1) and peripheral circuits (not shown in FIG. 1). The memory cells are also referred to as bit cells, and are configured to store memory bits. The peripheral cells are also referred to as logic cells that are disposed around the bit cells, and are configured to implement various logic functions. The logic functions of the logic cells include, for example, write and/or read decoding, word line selecting, bit line selecting, data driving and memory self-testing. The logic functions of the logic cells described above are given for the explanation purpose. Various logic functions of the logic cells are within the contemplated scope of the present disclosure.

In some embodiments, the bit cells and the logic cells are used in a memory device including, for example, SRAM. Alternatively stated, the memory device includes at least one bit cell and at least one logic cell, based on the macro 102. In some embodiments, at least one of the bit cells and the logic cells are implemented by 6 or 8 transistors.

Figure 2:
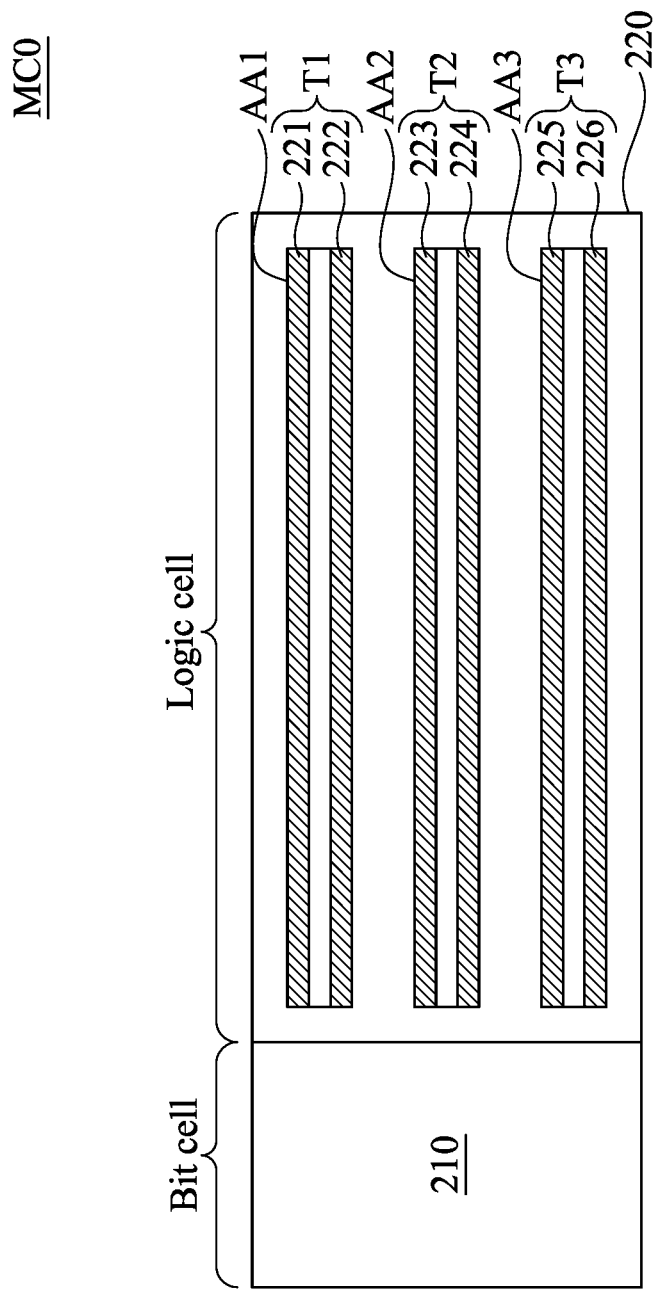
FIG. 2 is a schematic diagram of a memory device corresponding to the semiconductor device shown in FIG. 1, in accordance with some embodiments of the present disclosure.

Reference now made to FIG. 2. FIG. 2 is a schematic diagram of a memory device MC0 corresponding to the semiconductor device 100 shown in FIG. 1, in accordance with some embodiments of the present disclosure. In some embodiments, the memory device MC0 is generated according to the macro 102 shown in FIG. 1.

For illustration in FIG. 2, the memory device MC0 includes a bit cell 210 and a logic cell 220. The logic cell 220 abuts to the bit cell 210. The logic cell 220 includes active regions AA1, AA2 and AA3 (which are also referred to as active areas) configured to form transistors. For simplicity, each of the active regions AA1, AA2 and AA3 is referenced as AA hereinafter for illustration, because each of the active regions AA1, AA2 and AA3 operates in a similar way in some embodiments. The bit cell 210 also includes active regions AA (not shown) for forming transistors that are separated from the transistors formed in the logic cell 220. For simplicity of illustration, only few active regions AA are illustrated in the logic cell 220. Various elements for forming the transistors or other circuit units including, for example, conductive segments corresponding to sources and drains of the transistors, are not illustrated in FIG. 2 or other embodiments of the present disclosure.

The active regions AA in the logic cell 220 are arranged in columns and include active elements 221, 222, 223, 224, 225 and 226. For simplicity, each of the active elements 221, 222, 223, 224, 225 and 226 is referenced as FN hereinafter for illustration, because each of the active elements 221, 222, 223, 224, 225 and 226 operates in a similar way in some embodiments. The active elements FN are formed in a corresponding active regions AA. Specifically, the active elements 221 and 222 are formed in the active region AA1; the active elements 223 and 224 are formed in the active region AA2; and the active elements 225 and 226 are formed in the active region AA3. Moreover, the active elements FN are separated into several groups, including, for example, a first group T1 for forming a transistor, a second group T2 for forming another transistor, and a third group T3 for forming the other one transistor. Alternatively stated, one logic cell 220 includes more than three transistors, and each of these transistors is formed with at least two active elements FN. In other way to explain, with reference to FIG. 2, three transistors are included in the logic cell 220, and each of these transistors is generated based on two active elements FN that are separated into three groups T1, T2 and T3.

In some embodiments, the active regions AA are polysilicon. In some embodiments, the active regions AA are made of p-type doped material. In some other embodiments, the active regions AA are made of n-type doped material. In various embodiments, the active regions AA are configured to form channels of transistors. In some other embodiments, the active regions AA are fin-shaped active regions and are configured to form fin structures for forming fin field-effect transistors (FinFET). The active elements FN formed in these active regions AA are fin structures (hereinafter, fins FN in some embodiments of the present disclosure). For simplicity of illustration, only active regions AA and fins FN are illustrated in the logic cell 220. Various numbers of active regions AA and fins FN in the logic cell 220 are within the contemplated scope of the present disclosure.

The configuration of the memory device MC0 is given for illustrative purpose. Various configurations of the memory device MC0 are within the contemplated scope of the present disclosure. Moreover, the number and arrangement of the fins FN are given for illustrative purpose. Various numbers and arrangements of the fins FN to implement the logic cell 220 are within the contemplated scope of the present disclosure. For example, in some embodiments, a number of the fins FN in a corresponding group is more than two (e.g., three fins FN in the group T1), and the corresponding transistor is a FinFET with multi-fin structures (e.g., three-fins FinFET formed in the group T1). In alternative embodiments, the the fins FN are arranged in rows.

Figure 3:
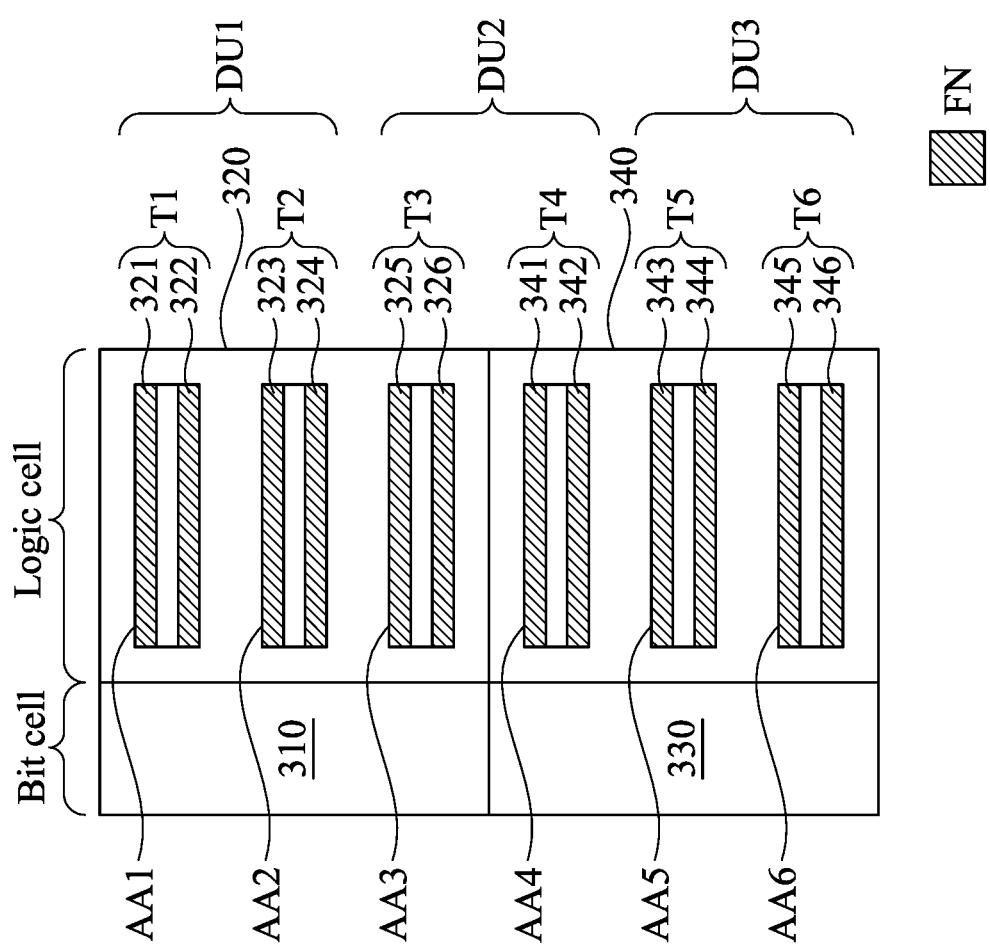
FIG. 3 is a schematic diagram of a memory device corresponding to the semiconductor device shown in FIG. 1, in accordance with some embodiments of the present disclosure.

Reference now made to FIG. 3. FIG. 3 is a schematic diagram of a memory device MC1 corresponding to the semiconductor device 100 shown in FIG. 1, in accordance with some embodiments of the present disclosure. In some embodiments, the memory device MC1 is generated according to the macro 102 shown in FIG. 1. In some embodiments, the memory device MC1 is constructed based on the memory device MC0 shown in FIG. 2.

For illustration in FIG. 3, the memory device MC1 includes bit cells 310, 330 and logic cells 320, 340. The bit cells 310, 330 and the logic cells 320, 340 are arranged in rows and columns as an array. The bit cell 310 is disposed next to the logic cell 320 along one row, and the bit cell 330 is disposed next to the logic cell 340 along another row that abuts to the row that is arranged with both of the bit cell 310 and the logic cell 320.

In some embodiments, the bit cell 310 is identical to the bit cell 330. In some other embodiments, the bit cell 310 is different from the bit cell 330, and the difference between the same including, for example, cell height and number of transistor formation. In various embodiments, the bit cells 310, 330 are identical to the bit cell 210 shown in FIG. 2.

In some embodiments, the bit cell 310 is coupled to at least one bit line that is same as which is coupled to the bit cell 330, configured to receive bit data transmitted from the bit line. Alternatively stated, the bit cell 310 and the bit cell 330 share at least one bit line for receiving same bit data. In various embodiments, the bit cell 310 is coupled to at least one word line that is same as which is coupled to the bit cell 330, configured to receive program data transmitted from the word line. Alternatively stated, the bit cell 310 and the bit cell 330 share at least one word line for receiving same program data.

In some embodiments, the logic cell 320 is identical to the logic cell 340. In some other embodiments, the logic cell 320 is different from the logic cell 340, and the difference between the same including, for example, cell height and logic function. In various embodiments, the logic cells 320, 340 are identical to the bit cell 210 shown in FIG. 2.

In some embodiments, the logic cell 320 is coupled to at least one signal line that is same as which is coupled to the logic cell 340, configured to receive program data transmitted from the signal line. In various embodiments, the logic cell 320 is coupled to signal lines that are alternative from which are coupled to the logic cell 340, configured to receive program data transmitted from the signal line.

With continued reference to FIG. 3, the logic cell 320 includes active regions AA1, AA2 and AA3, and the active regions AA1, AA2 and AA3 are configured to form fins 321, 322, 323, 324, 325 and 326 arranged in columns, respectively. The logic cell 340 includes active regions AA4, AA5 and AA6, and the active regions AA4, AA5 and AA6 are configured to form fins 341, 342, 343, 344, 345 and 346 arranged in columns, respectively. For simplicity, each of the fins 321, 322, 323, 324, 325, 326, 341, 342, 343, 344, 345 and 346 is referenced as FN hereinafter for illustration, because each of the fins 321, 322, 323, 324, 325, 326, 341, 342, 343, 344, 345 and 346 is fin structure in some embodiments of the present disclosure and operates in a similar way in some embodiments.

The fins FN are separated into groups including, with reference to FIG. 3, groups T1, T2, T3, T4, T5 and T6, for forming respective transistors. For simplicity, each of the groups T1, T2, T3, T4, T5 and T6 is referenced as TN hereinafter for illustration, because each of the groups T1, T2, T3, T4, T5 and T6 operates in a similar way in some embodiments. Specifically, in the logic cell 320, the fins 321 and 322 included in the active region AA1 are separated into the group T1; the fins 323 and 324 included in the active region AA2 are separated into the group T2 and the fins 325 and 326 included in the active region AA3 are separated into the group T3. In the logic cell 340, the fins 341 and 342 included in the active region AA4 are separated into the group T4; the fins 343 and 344 included in the active region AA5 are separated into the group T5 and the fins 345 and 346 included in the active region AA6 are separated into the group T6. Alternatively stated, multiple transistors are formed in the fins FN that are separated into respective groups, and these groups are disposed next to each other and arranged in columns. For example, with reference to FIG. 3, a transistor (not shown) is formed in the group T1 including the fins 321 and 322, and another transistor disposed next to that transistor is formed in the group T2 including the fins 323 and 324.

Each two adjacent groups TN are separated into one device unit. Specifically, the group T1 and T2 are indicated as a device unit DU1; the group T3 and T4 are indicated as a device unit DU2; and the group T5 and T6 are indicated as a device unit DU3. Alternatively stated, one device unit DU1, DU2 or DU3 includes two adjacent groups TN, and each of these groups TN includes two fins FN for forming one transistor. With reference to FIG. 3, the device unit DU1 includes the groups T1 and T2 that include the fins 321, 322, 323 and 324 for forming two adjacent transistors; the device unit DU2 includes the groups T3 and T4 that include the fins 325, 326, 341 and 342 for forming another two adjacent transistors; and the device unit DU3 includes the groups T5 and T6 that include the fins 343, 344, 345 and 346 for forming the other two adjacent transistors. In another way to explain, the device unit DU1 and half of the device unit DU2 are arranged in the logic cell 320, and half of the device unit DU2 and the device unit DU3 are arranged in the logic cell 340. Therefore, more than one device unit DU1, DU2 or DU3 is arranged in the logic cell 320 or 340, and more than two device units DU1, DU2 or DU3 are arranged in the logic cells 320 and 340 in the memory device MC1. For simplicity, each of the device units DU1, DU2 and DU3 is referenced as DU hereinafter for illustration, because each of the device units DU1, DU2 and DU3 operates in a similar way in some embodiments.

In some embodiments, the transistors formed in at least two adjacent groups TN are different from one another. For example, with reference to FIG. 3, in the logic cell 320, a transistor formed in the group T1 is a p-type metal oxide semiconductor (PMOS) transistor, and a transistor formed in the group T2 is a n-type metal oxide semiconductor (NMOS) transistor. Furthermore, the device unit DU1, including the group T1 and T2, includes one PMOS transistor and one NMOS transistor. In some other embodiments, the transistors formed in at least two adjacent groups TN are identical to each other. For example, with reference to FIG. 3, in the logic cell 320, a transistor formed in the group T2 is a NMOS transistor, and a transistor formed in the group T3 is also a NMOS transistor. In various embodiments, types of the transistors formed in the corresponding groups TN are determined based on the arrangement of the device units DU, and each of the device units DU includes two transistors of different types. For example, with reference to FIG. 3, the device unit DU1 includes a PMOS transistor formed in the group T1 and a NMOS transistor formed in the group T2; the device unit DU2 includes a NMOS transistor formed in the group T3 and a PMOS transistor formed in the group T4; and the device unit DU3 includes a PMOS transistor formed in the group T5 and a NMOS transistor formed in the group T6. In some embodiments, one device unit DU including at least one PMOS and at least one NMOS is also indicated as one logic circuit unit, for implementing a fundamental logic function.

The above configuration of the memory device MC1 is provided for illustrative purposes. Various implementations of the memory device MC1 are within the contemplated scope of the present disclosure. For example, in various embodiments, the bit cells 310 and 330 are arranged in rows, and the logic cells 320 and 340 are arranged in columns.

In some approaches, only few fins formed in a corresponding active region are arranged in the logic cells. Specifically, in one logic cell, a number of the fins is limited to being below four, for forming transistors that are less than two (i.e., less than one device unit). Alternatively stated, in two adjacent logic cells, less than two device units are included, and it has low active region density and further leads to poor area scaling in one memory device.

Compared to the above approaches, in the embodiments of the present disclosures, for example with reference to FIG. 3, in one logic cell 320 or 340, a number of the fins FN is at least six, for forming transistors that are more than three and forming device units DU that are more than one and half. Alternatively stated, with reference 3, it is able to arrange three device units DU for implementing three logic circuit units in two adjacent logic cells 320 and 340. Accordingly, in two adjacent logic cells 320 and 340 of the memory device, both of the active region density and area scaling increase, and it further achieves one and half times of the device unit density.

Figure 4:
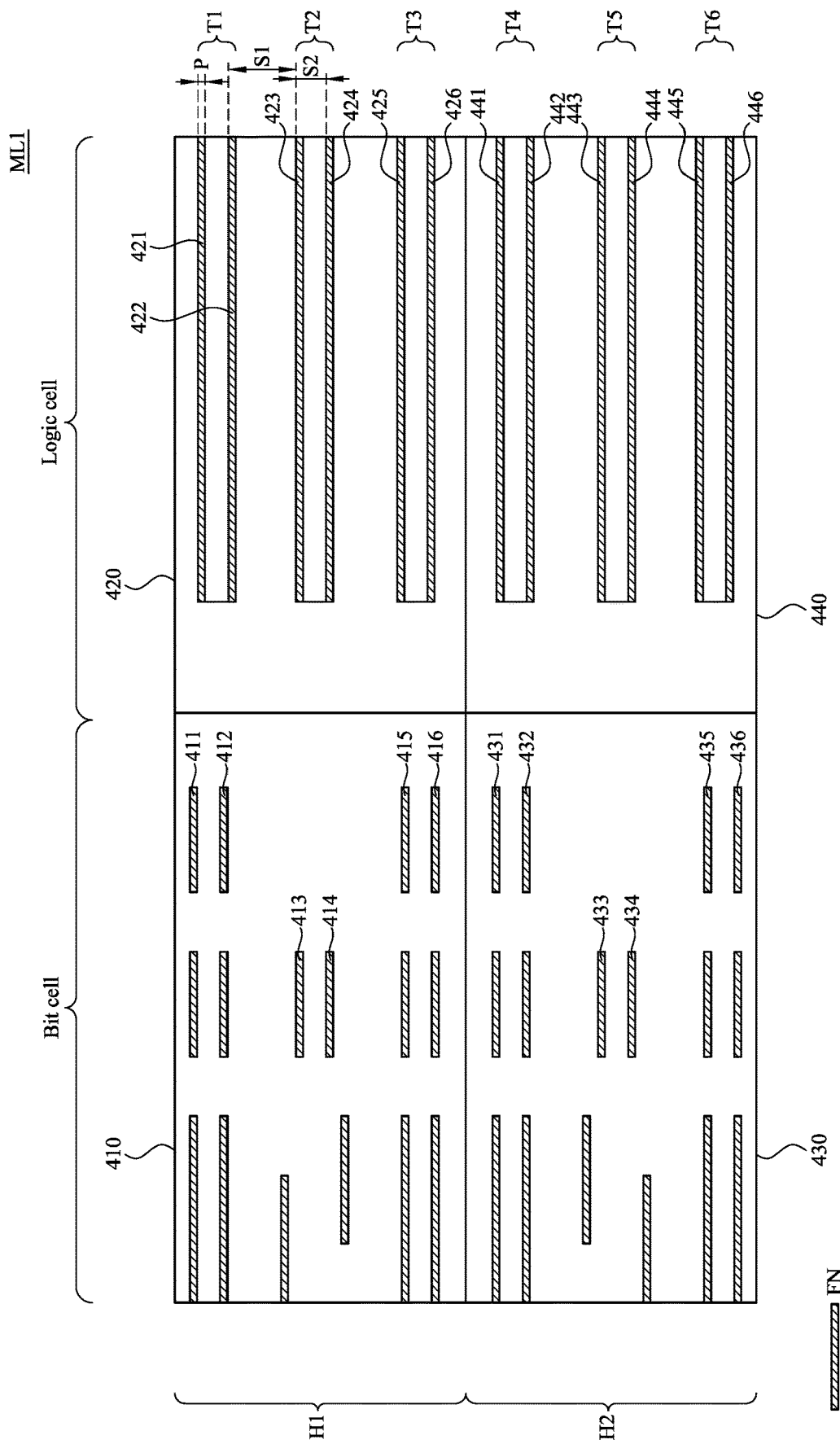
FIG. 4 is a layout diagram of the memory device shown in FIG. 3, in accordance with some embodiments of the present disclosure.

Reference now made to FIG. 4. FIG. 4 is a layout diagram ML1 of the memory device MC1 shown in FIG. 3, in accordance with some embodiments of the present disclosure. For simplicity of illustration, only fins FN are illustrated in the layout diagram ML1, and each of the fins FN is disposed in a corresponding active region (not labeled). Various patterns for forming transistors or other circuit units including, for example, conductive segments and vias, are not illustrated in FIG. 4 or other embodiments of the present disclosure. With respect to the embodiments of FIG. 3, like elements in FIG. 4 are designated with the same reference numbers for ease of understanding.

With references to FIGS. 3 and 4, the bit cell 410 corresponds to the bit cell 310 shown in FIG. 3; the bit cell 430 corresponds to the bit cell 330 shown in FIG. 3; the logic cell 420 corresponds to the logic cell 320 shown in FIG. 3; and the logic cell 440 corresponds to the logic cell 340 shown in FIG. 3. Furthermore, in the logic cell 420, the fins 421, 422, 423, 424, 425 and 426 correspond to the fins 321, 322, 323, 324, 325 and 326 shown in FIG. 3, respectively; and in the logic cell 440, the fins 441, 442, 443, 444, 445 and 446 correspond to the fins 341, 342, 343, 344, 345 and 346 shown in FIG. 3, respectively.

Compared to the embodiments illustrated in FIG. 3, the bit cells 410 and 430 include separated fins FN. For simplicity, only few fins FN in bit cells 410 and 430 are labeled in FIG. 4 for illustration, including, for example, the fins 411, 412, 413, 414, 415 and 416 in the bit cell 410, and the fins 431, 432, 433, 434, 435 and 436 in the bit cell 430. In some embodiments, each of the fins FN in the bit cells 410 and 430 is configured to form one transistor. For example, in the bit cell 410, a first transistor is formed in an active region (not shown) including the fin 411; a second transistor that is disposed next to the first transistor is formed in an active region including the fin 412; a third transistor is formed in an active region including the fin 413; a fourth transistor is formed in an active region including the fin 414; a fifth transistor is formed in an active region including the fin 415; and a sixth transistor is formed in an active region including the fin 416. Therefore, there are at least six transistors generated in one bit cell 410. Similarly, the bit cell 430 also includes six transistors formed with the corresponding fins FN.

Furthermore, the bit cell 410 has a cell height H1, and the bit cell 430 has a cell height H2. In some embodiments, the cell height H1 is equal to the cell height H2. In some other embodiments, the cell height H1 is substantially equal to the cell height H2. In various embodiments, the cell height H1 is different from the cell height H2. In some embodiments, the cell height H1 or H2 is determined based on a type of the bit cell 410 or 430 that is one of standard cells in a library of standard cells (which is discussed with reference to FIG. 9). In various embodiments, the bit cells 410 and 430 are symmetrical structures with respect to columns.

In some embodiments, a cell height of the logic cell 420 is determined based on the cell height H1 of the bit cell 410, and a cell height of the logic cell 440 is determined based on the cell height H2 of the bit cell 430. In various embodiments, the logic cell 420 disposed next to the bit cell 410 also has the cell height H1, and the logic cell 440 disposed next to the bit cell 430 also has the cell height H2.

A width of the fins FN is a fixed width. In some embodiments of the present disclosure, the active regions (e.g., active regions AA1-AA6 shown in FIG. 3) including the fins FN are fin-shaped active regions for forming fin structures of the transistors, and the fins FN are fin structures. The fixed width of each of the fins FN is indicated as one fin width, for example, a fin width P of the fin 421 shown in FIG. 4. With continued reference to FIG. 4, each of the fins FN in all of the bit cells 410, 430 and logic cells 420 and 440 has a fixed width, and is also referred to as the fin width P. For simplicity, only one fin width P is illustrated with the fin 431.

At least one length of the fins FN in the bit cells 410 and 430 is different from another length of the same. A length of the fins FN in the logic cells 420 and 440 is same as one another. In some embodiments, a length of the fins FN in the bit cells 410 and 430 is different from a length of the fins FN in the logic cells 420 and 440. In some other embodiments, a length of the fins FN in the bit cells 410 and 430 is shorter than a length of the fins FN in the logic cells 420 and 440. In various embodiments, a length of the fins FN in the bit cells 410 and 430 is substantially equal to a length of the fins FN in the logic cells 420 and 440.

Moreover, a distance between each two adjacent groups TN is indicated as a distance S1 shown in FIG. 4. In some embodiments, the distance S1 between two adjacent active regions (i.e., two adjacent groups TN) is also indicated as an active region spacing that is restricted to design rules of the layout diagram ML1. Alternatively stated, one fin FN of one group TN (referred to as group T1' herein) is separated from another one fin FN of another group TN (referred to as group T2' herein). The group T1' is disposed next to the group T2' and separated from each other by at least one active region spacing. With continued reference to FIG. 4, the distance between each two adjacent groups TN, including, for example, between the groups T1 and T2, between the groups T2 and T3, between the groups T3 and T4, between the groups T4 and T5, and between the groups T5 and T6, is same as one another, and is equal to the distance S1. For simplicity, only one distance S1 is illustrated between the group T1 and the group T2 in FIG. 4. Specifically, the distance S1 is a distance between a top edge of one fin FN in one group T1' and a top edge of one fin in another group T2' that is adjacent to the group T1'. For example, as illustrated in FIG. 4, the distance S1 is a distance between a top edge of the fin 422 in the group T1 and a top edge of the fin 423 in the group T2.

In some embodiments, a distance between at least two adjacent groups TN is different from a distance between other two adjacent groups TN. Alternatively stated, at least two adjacent groups TN are separated by a first distance, and at least other two adjacent groups TN are separated by a second distance. The first distance is different from the second distance. For example, with reference to FIG. 4, the group T1 is separated from the group T2 by a first distance (which is the distance S1); the group T2 is separated from the group T3 by a second distance (not shown in FIG. 4); the group T3 is separated from the group T4 by a third distance (not shown in FIG. 4); the group T4 is separated from the group T5 by a fourth distance (not shown in FIG. 4); and the group T5 is separated from the group T6 by a fifth distance (not shown in FIG. 4). The first distance is different from at least one of the second distance, the third distance, the fourth distance, or the fifth distance. In another way to explain, at least one active region spacing among several groups TN is different from the others.

Furthermore, a distance between each two adjacent fins FN of one group TN is indicated as a distance S2 shown in FIG. 4. In some embodiments, the distance S2 between two adjacent fins FN of each groups TN is also indicated as a fin pitch (which will discuss with reference to FIGS. 6A-6B) that is restricted to at least one of the cell height, the design rules of the layout diagram ML1 and limitations of the fabrication. Alternatively stated, one fin FN (referred to as fin F1 herein) is separated from another one fin FN (referred to as fin F2 herein). The fins F1 and F2 are indicated as one group for forming a same transistor. The fin F1 is disposed next to the fin F2, and is separated from the fin F2 by at least one fin pitch. With continued reference to FIG. 4, the distance between each two adjacent fins FN of a corresponding group TN, including, for example, between the fins 421 and 422 of the group T1, between the fins 423 and 424 of the group T2, between the fins 425 and 426 of the group T3, between the fins 441 and 442 of the group T4, between the fins 442 and 444 of the group T5, and between the fins 445 and 446 of the group T6, is same as one another, and is equal to the distance S2. For simplicity, only one distance S2 is illustrated between the adjacent fins 423 and 424 of the group T2 in FIG. 4.

In some embodiments, a distance between two adjacent fins FN of one group TN is different from a distance two adjacent fins FN of another group TN. Alternatively stated, two adjacent fins FN of at least one group TN are separated from each other by a first distance, and two adjacent fins FN of at least another group TN are separated from each other by a second distance. The first distance is different from the second distance. For example, with reference to FIG. 4, the fins 421 and 422 of the group T1 are separated by a first distance (not shown in FIG. 4); the fins 423 and 424 of the group T2 are separated by a second distance (which is the distance S2); the fins 425 and 426 of the group T3 are separated by a third distance; the fins 441 and 442 of the group T4 are separated by a fourth distance; the fins 442 and 444 of the group T5 are separated by a fifth distance; and the fins 445 and 446 of the group T6 are separated by a sixth distance. The first distance is different from at least one of the second distance, the third distance, the fourth distance, the fifth distance, or the sixth distance.

The configuration of layout diagram ML1 is given for illustrative purposes. Various configurations of layout diagram ML1 are within the contemplated scope of the present disclosure. For example, in various embodiments, each fins FN in the bit cells 410 and 430 has a length that is substantially equal to each other.

Figure 5:
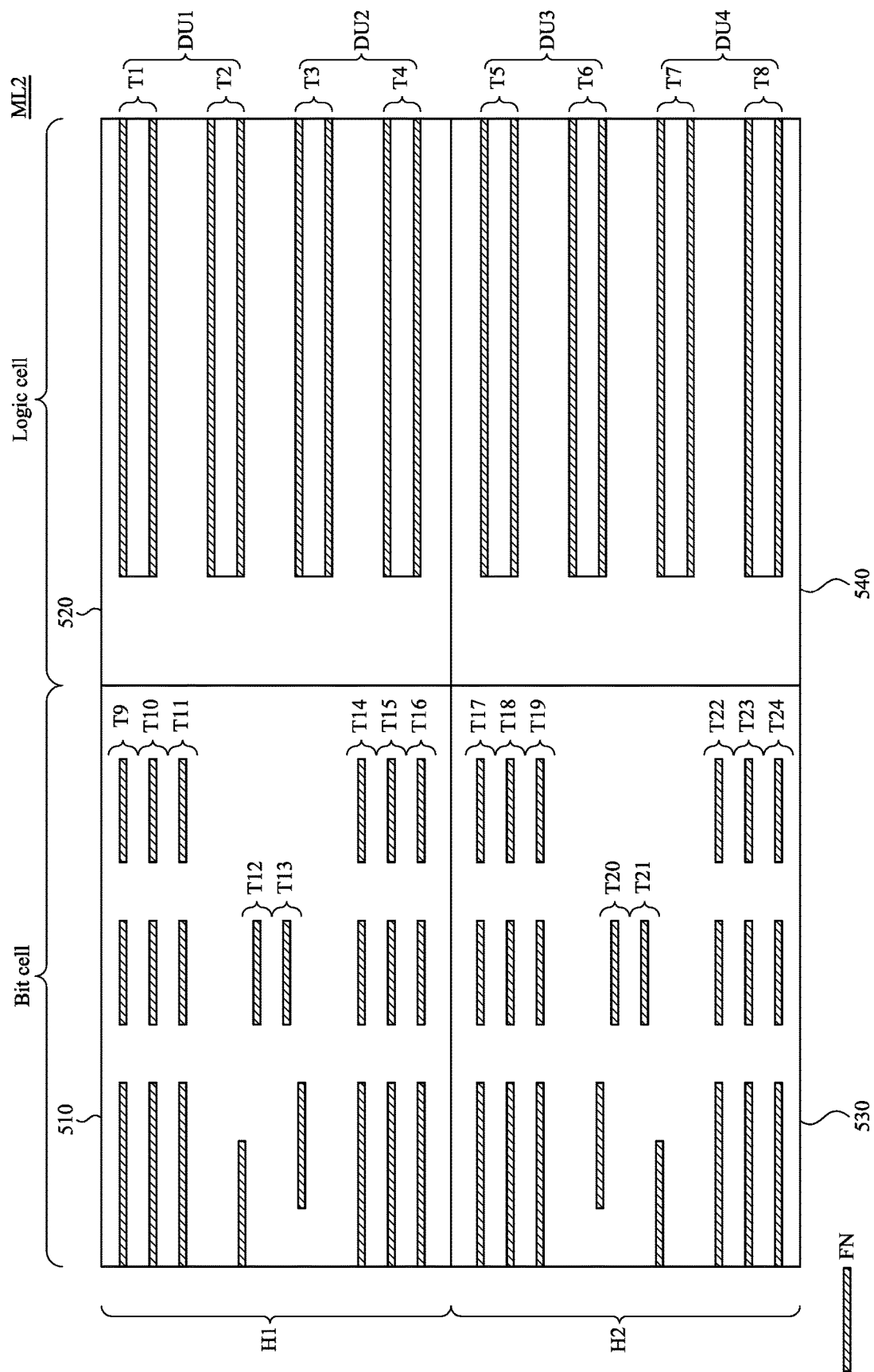
FIG. 5 is a layout diagram of a memory device corresponding to the semiconductor device shown in FIG. 1, in accordance with some embodiments of the present disclosure.

Reference now made to FIG. 5. FIG. 5 is a layout diagram ML2 of a memory device corresponding to the semiconductor device 100 shown in FIG. 1, in accordance with some embodiments of the present disclosure. In some embodiments, the layout diagram ML2 shown in FIG. 5 is an alternative embodiment of the layout diagram ML1 shown in FIG. 4. With respect to the embodiments of FIG. 4, like elements in FIG. 5 are designated with the same reference numbers for ease of understanding.

Compared to the embodiments illustrated in FIG. 4, a number of the fins FN included in each of the bit cells 510 and 530 is more that of the same included in each of the bit cells 410 and 430 shown in FIG. 4. Alternatively stated, a number of transistors formed in the bit cells 510 and 530 is more than that of the same formed in the bit cells 410 and 430 shown in FIG. 4. For example, with reference to FIG. 5, in the bit cell 510, transistors corresponding to groups T9, T10, T11, T12, T13, T14, T15 and T16 are formed in the corresponding active regions (not labeled) that include fins FN (which is not labeled one-by-one for simplified illustration). Therefore, there are at least eight transistors generated in one bit cell 510, which is more than at least six transistors generated in the bit cell 410 in FIG. 4. Similarly, the bit cell 530 also includes eight transistors, including, for example, transistors corresponding to groups T17, T18, T19, T20, T21, T22, T23 and T24, formed in corresponding active regions (not labeled) that include the fins FN.

Moreover, a number of the fins FN included in each of the logic cells 520 and 540 is more that of the same included in each of the logic cells 420 and 440 shown in FIG. 4, respectively. Alternatively stated, a number of transistors formed in the logic cells 520 and 540 is more that of the same formed in the logic cells 420 and 440 shown in FIG. 4. For example, with reference to FIG. 5, in the logic cells 520, the transistors corresponding to groups T1, T2, T3 and T4 are formed. Therefore, there are at least four transistors generated in one logic cell 520, which is more than three transistors generated in the logic cell 420 in FIG. 4. Similarly, the logic cells 540 also include four transistors corresponding to groups T5, T6, T7 and T8.

Furthermore, in some embodiments, two adjacent groups TN are separated into one device unit DU. A number of the device units DU included in each of the logic cells 520 and 540 is more that of the same included in each of the logic cells 420 and 440 shown in FIG. 4, respectively. For example, with reference to FIG. 5, at least two device units DU, including, for example, device units DU1 including the groups T1 and T2, and device units DU2 including the groups T3 and T4, are included in the logic cells 520. It is more than 0.5 device unit DU included in the logic cell 420 shown in FIG. 4. Similarly, the logic cells 540 also include two device units DU, including, for example, device unit DU3 including the groups T5 and T6, and device unit DU4 including the groups T7 and T8.

Figure 6A:
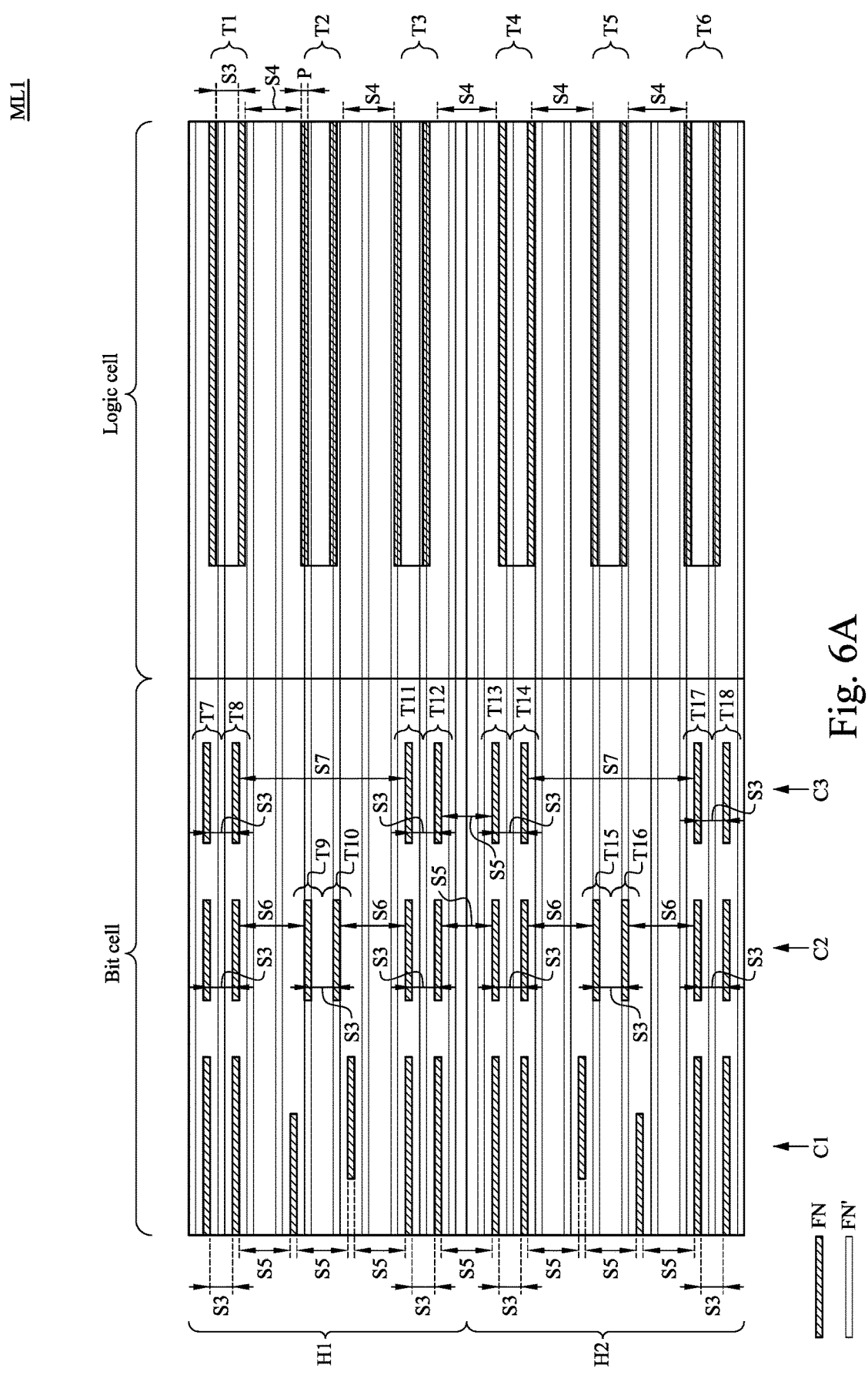
FIGS. 6A-6B are layout diagrams of the memory device shown in FIG. 3, in accordance with some embodiments of the present disclosure.
Figure 6B:
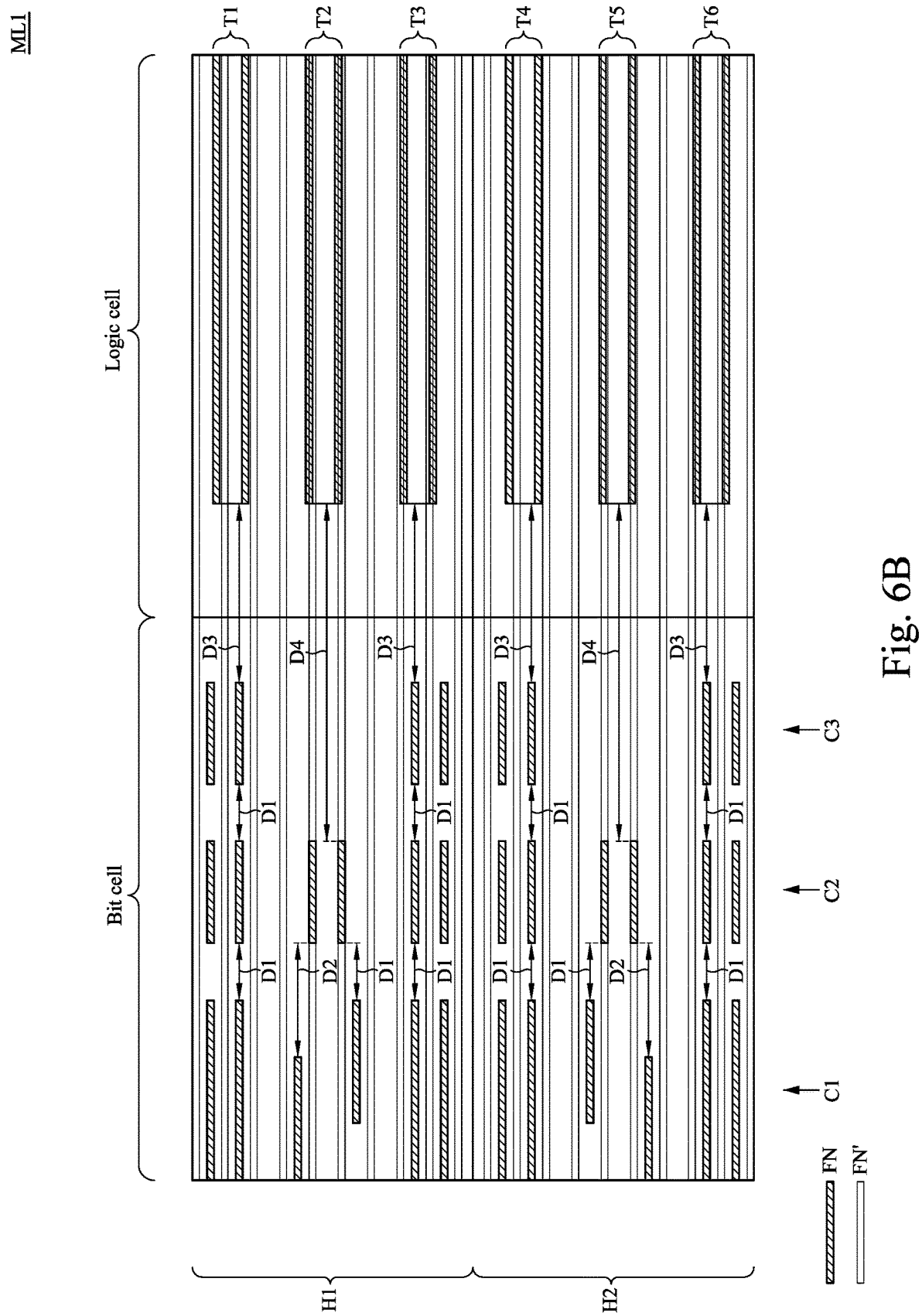

Reference now made to FIGS. 6A and 6B. Each of FIGS. 6A-6B is a layout diagram ML1 of the memory device MC1 shown in FIG. 3, in accordance with some embodiments of the present disclosure. In some embodiments, the layout diagram ML1 shown in FIGS. 6A-6B is alternative embodiments of the layout diagram ML1 shown in FIG. 4. With respect to the embodiments of FIGS. 3-4, like elements in FIGS. 6A-6B are designated with the same reference numbers for ease of understanding. For simplicity, with respect to the embodiments of FIGS. 3-4, some of elements in FIGS. 6A-6B are not labeled with identical elements for ease of understanding.

Compared to the embodiments illustrated in FIG. 4, active region grids FN' are illustrated, and extend across the bit cells and logic cells along rows. In some embodiments of the present disclosure, the fins FN are fin structures of the transistors, and the active region grids FN' are indicated as fin grids FN' hereinafter. In some embodiments, a width of the fin grids FN' is equal to each other, and is further equal to a width of each fins FN. Alternatively stated, each of the fin grids FN' has a width that is equal to a fixed width of the fins FN, which is referred to as the fin width P shown in FIGS. 4 and 6A. In some embodiments, a distance between each two adjacent fin grids FN' is equal to each other, and is referred to as the fin pitch. In various embodiments, the fin grids FN' are reference grids for generating the layout diagram ML1. Alternatively stated, the layout diagram ML1 including the bit cells and the logic cells is generated based on the fin grids FN'.

Distances between each two adjacent fins FN along columns are illustrated in FIG. 6A, and distances between each two adjacent fins FN along rows are illustrated in FIG. 6B. Alternatively stated, vertical distances between the fins FN are illustrated in FIG. 6A, and horizontal distances between the fins FN are illustrated in FIG. 6B. In some embodiments, the distances illustrated in FIGS. 6A-6B are also referred to as intervals between the fins FN. For example, with reference to FIG. 6A, a vertical distance between fins FN (i.e., indicated as distance S3) is calculated from a bottom edge of one fin FN (i.e., indicated as group T7) to a top edge of the other fin FN (i.e., indicated as group T8). As another example illustrated in FIG. 6B, a horizontal distance between fins FN (i.e., indicated as distance D3) is calculated from a right edge of one fin FN (i.e., indicated as group T7 shown in FIG. 6A) to a left edge of the other fin FN (i.e., indicated as group T1). The distances shown in FIGS. 6A-6B are given for illustrative purpose. Various configurations of distances are within the contemplated scope of the present disclosure.

With reference to FIG. 6A, the fins FN in the bit cells are separated by difference distances along columns. For the leftmost-column fins FN in the bit cells (indicated as a column C1), twelve fins FN are arranged in rows and separated from each other by different distances including, for example, from the top row to the bottom row, distances S3, S5, S5, S5, S3, S5, S3, S5, S5, S5 and S3. For the middle-column fins FN in the bit cells (indicated as a column C2), twelve fins FN are arranged in rows and separated from each other by different distances including, for example, from the top row to the bottom row, distances S3, S6, S3, S6, S3, S5, S3, S6, S3, S6 and S3. For the rightmost-column fins FN in the bit cells (indicated as a column C3), eight fins FN are arranged in rows and separated from each other by different distances including, for example, from the top row to the bottom row, distances S3, S7, S3, S5, S3, S7 and S3.

Furthermore, in the bit cells, some of the fins FN are directly disposed in the fin grids FN' in the layout diagram ML1. Alternatively stated, some of the fins FN in the bit cells are directly overlapped with the fin grids FN' in a layout view, and it is also indicated that these fins FN are arranged on the fin grids FN'. On the other hand, some of the fins FN in the bit cells are separated from the fin grids FN' in a layout view, and it is also indicated that these fins FN are arranged off the fin grids FN'. In some embodiments, some of the fins FN in the bit cells are partially overlapped with the fin grids FN' in a layout view, and it is also indicated as these fins FN being arranged off the fin grids FN'. For example, with reference to FIG. 6A, a group T9 in the middle-column C2 of the bit cells, is completely overlapped with the corresponding fin grid FN', and a group T8 in the rightmost-column C3 in the bit cells, is not overlapped with the corresponding fin grid FN'.

The fins FN in the logic cells are separated by different distances along columns. Specifically, in the logic cells, two adjacent fins FN in the corresponding groups TN are separated from one another by a first spacing (indicated as a distance S3). Furthermore, two adjacent groups TN are separated from one another by a second spacing (indicated as a distance S4).

In some embodiments, each of the fins FN in a corresponding group TN is separated by a same spacing (e.g., the distance S3 shown in FIG. 6A). In some other embodiments, a distance between two adjacent fins FN in one group TN is different from a distance between two adjacent fins FN in another group TN. For example, with continued reference to FIG. 6A, two adjacent fins FN in the group T1 are separated from each other by the distance S3, and two adjacent fins FN in the group T2 are separated from each other by a distance that is different from the distance S3.

In some embodiments, each two adjacent of the groups TN is separated from each other by a same spacing (e.g., the distance S4 shown in FIG. 6A). For example, with continued reference to FIG. 6A, two adjacent groups T1 and T2 are separated from each other by the distance S4. In some other embodiments, at least two adjacent groups TN are separated from the others by different spacing. Alternatively stated, at least two adjacent groups TN are separated from one another by a first distance, and another two adjacent groups TN are separated from one another by a second distance that is different from the first distance. For example, with continued reference to FIG. 6A, the distance between the groups T1 and T2 is different from at least one distance between the groups T2 and T3, between the groups T3 and T4, between the groups T4 and T5, or between the groups T5 and T6.

Furthermore, in the logic cells, some of the fins FN are partially disposed in the fin grids FN' in the layout diagram ML1. Alternatively stated, some of the fins FN in the logic cells are partially overlapped with the fin grids FN' in a layout view, and it is also indicated that these fins FN are arranged off the fin grids FN'. In some embodiments, some of the fins FN in the logic cells are separated from the fin grids FN' in a layout view, and it is also indicated as these fins FN being arranged off the fin grids FN'. In various embodiments, in the logic cells, some of the fins FN are directly disposed in the fin grids FN' in the layout diagram ML1. Alternatively stated, some of the fins FN in the logic cells are directly overlapped with the fin grids FN' in a layout view, and it is also indicated that these fins FN are arranged on the fin grids FN'. For example, with reference to FIG. 6A, the fins FN are arranged off the fin grids FN'.

In some embodiments, since the layout diagram ML1 is generated based on the fin grids FN', the distances between two adjacent fins FN are determined based on the fin pitch. Furthermore, design of the fins FN for forming the fin structures of transistors is also based on the advanced technology. Alternatively stated, the arrangement of the fins FN is determined based on the fin grids FN' and the fabrication limitations. In some embodiments, the arrangement of the fins FN is further determined based on the cell height of the bit cells.

For example, with reference to FIG. 6A, for the cells with the cell height H1 and H2, the distance S3 is substantially equal to a distance between two adjacent fin grids FN' (i.e., one fin pitch) subtracted the width of the fin grids FN' (i.e., the distance P). Alternatively stated, these two adjacent fin grids FN' are separated from each other by the distance S2 (which is discussed with reference to FIG. 4), and it is also indicated as one fin pitch in some embodiments. The distance S4 is in a range of one fin pitch to two times of the fin pitch (i.e., S4=1*fin pitch–2*fin pitch). The distance S5 is in a range of one fin pitch to two times of the fin pitch (i.e., S5=1*fin pitch–2*fin pitch), and is larger than the distance S3. The distance S6 is in a range of two times of the fin pitch to three times of the fin pitch (i.e., S6=2*fin pitch–3*fin pitch). The distance S7 is in a range of five times of the fin pitch to six times of the fin pitch (i.e., S7=5*fin pitch–6*fin pitch).

In some embodiments, a distance between at least two adjacent groups TN in the logic cells is not an integral of the fin pitch. For example, in some embodiments, the distance S4 between two adjacent groups TN is substantially equal to the fin pitch multiplied by a number, which is not an integral and is in a range of one to two. Specifically, the distance S4 is a distance between a top edge of one fin FN in the group T1 and a top edge of one fin FN in the group T2. The distance S4 is not an integral multiple of the fin pitch. On the other hand, the distance S2 (which is shown in FIG. 4) between two adjacent fins FN of a corresponding group TN is substantially equal to the fin pitch multiplied by an integral, which is one. This integral is smaller than such number. For example, the integral is equal to 1, and thus the distance S2 between two adjacent fins FN is equal to the fin pitch multiplied by 1. The number is equal to 1.2 which is larger than the integral 1, and thus the distance S4 between two adjacent groups TN is equal to fin pitch multiplied by 1.2. In some other embodiments, the number is smaller than the integral, and the number is not an integral either. In some other embodiments, a distance between at least two adjacent groups TN in the logic cells is an integral of the fin pitch, when these two adjacent groups TN are arranged off the fin grids FN' and have a same shift with respect to the fin grids FN'.

Moreover, some fins FN in the bit cells are not aligned with some fins FN in the logic cells, with respect to the neighboring fin grids FN' among these fins FN. Alternatively stated, at least one fin FN in the bit cells is not aligned with or is substantially aligned with at least one fin FN in the logic cells along the rows. For example, in some embodiments, with continued reference to FIG. 6A, two groups T7 and T8 in the rightmost-column C3 of the bit cells are arranged off the fin grids FN', and the group T1, disposed next to these groups T7 and T8 along the rows, are arranged off the fin grids FN' either. Since the separation between the groups T7 and T8 and the fin grids FN' is different from that between the group T1 and the fin grids FN', the groups T7 and T8 in the bit cell are not aligned with the group T1 in the logic cell along the rows. The groups T11 and T12 in the rightmost-column C3 of the bit cells are not aligned with the group T3 in the logic cell along the rows. Similarly, in the rightmost-column C3 of the bit cells, the groups T13 and T14 are not aligned with the group T4 in the logic cell along the rows, and the groups T17 and T18 are not aligned with the group T6 in the logic cell along the rows.

In some embodiments, some fins FN in the bit cells are aligned with some fins FN in the logic cells, with respect to the neighboring fin grids FN' among these fins FN. Alternatively stated, at least one fin FN in the bit cells is aligned with at least one fin FN in the logic cells along the rows. For example, with continued reference to FIG. 6A, in the middle-column C2 of the bit cells, the groups T9 and T10 are aligned with the group T2 in the logic cell along the rows, and the groups T15 and T16 are aligned with the group T5 in the logic cell along the rows.

With reference to FIG. 6B, the fins FN in the logic cells are separated by different distances along rows. In the bit cells, the fins FN in the leftmost-column C1 is separated from the fins FN in the middle-column C2 by distances including, for example, from the top row to the bottom row, distances D1, D2, D1, D1, D1, D2 and D1. In some embodiments, the fins FN in the bit cells are separated by a same distance along rows. For example, with continued reference to FIG. 6A, the fins FN in the middle-column C2 is separated from the fins FN in the rightmost-column C3 by distances including, for example, from the top row to the bottom row, distances D1, D1, D1 and D1.

Furthermore, the groups between the bit cells and the logic cells are separated by different distances along rows. Specifically, one fin FN in the bit cells is separated from the fins FN of the groups TN by a first distance, and another one fin FN in the bit cells is separated from the fins FN of the groups TN by a second distance that is different from the first distance. For example, with continued reference to FIG. 6B, the group T8 in the rightmost-column C3 of the bit cells (which is labeled in FIG. 6A) is separated from the group T1 of the logic cells by a distance D3; the group T10 in the middle-column C2 (which is labeled in FIG. 6A) is separated from the group T2 by a distance D4; the group T11 in the rightmost-column C3 (which is labeled in FIG. 6A) is separated from the group T2 by the distance D3; the group T14 in the rightmost-column C3 of the bit cells (which is labeled in FIG. 6A) is separated from the group T4 by the distance D3; the group T16 in the middle-column C2 (which is labeled in FIG. 6A) is separated from the group T5 by the distance D4; and the group T17 in the rightmost-column C3 (which is labeled in FIG. 6A) is separated from the group T6 by the distance D3.

In some embodiments, the arrangement of the fins FN is determined based on at least the fin grids FN' or active areas for forming gate structures of transistors. As such, the distances between the fins FN in the bit cells and the fins FN in the logic cells along the rows are associated with at least the fin pitch or a poly pitch which is, in some embodiments, referred to as a minimum distance between two adjacent gate structures. For example, with reference to FIG. 6B, the distance D1 is substantially equal to one poly pitch; the distance D2 is substantially equal to two times of the poly pitch (i.e., D2≈2*poly pitch); the distance D3 is substantially in a range of four times of the poly pitch to seven times of the poly pitch (i.e., D3=4*poly pitch–7*poly pitch); and the distance D4 is substantially in a range of seven times of the poly pitch to ten times of the poly pitch (i.e., D4=7*poly pitch–10*poly pitch).

The above configuration of the layout diagram ML1 is provided for illustrative purposes. Various implementations of the layout diagram ML1 are within the contemplated scope of the present disclosure.

In some approaches, when the fins are arranged in the logic cells, each of the fins is arranged on the fin grids. As such, the active region spacing between two adjacent groups of the fins is limited to being as an integral of the fin pitch, and further affects the active region density of the memory device. Moreover, since the active region spacing is constrained, it does not provide a customized arrangement of the fins formed in the active regions.

Compared to the above approaches, in the embodiments of the present disclosures, for example with reference to FIG. 4, 6A or 6B, in the logic cells, at least one of the fins FN is arranged off the fin grids FN'. Accordingly, the active region spacing between two adjacent groups TN of the fins FN is not limited by the fin pitch constraint. Also, it may provide a dense active region density of the memory device, and also provide a customized arrangement of the fins FN formed in the corresponding active regions (which are the active regions AA shown in FIG. 3).

Figure 7A:
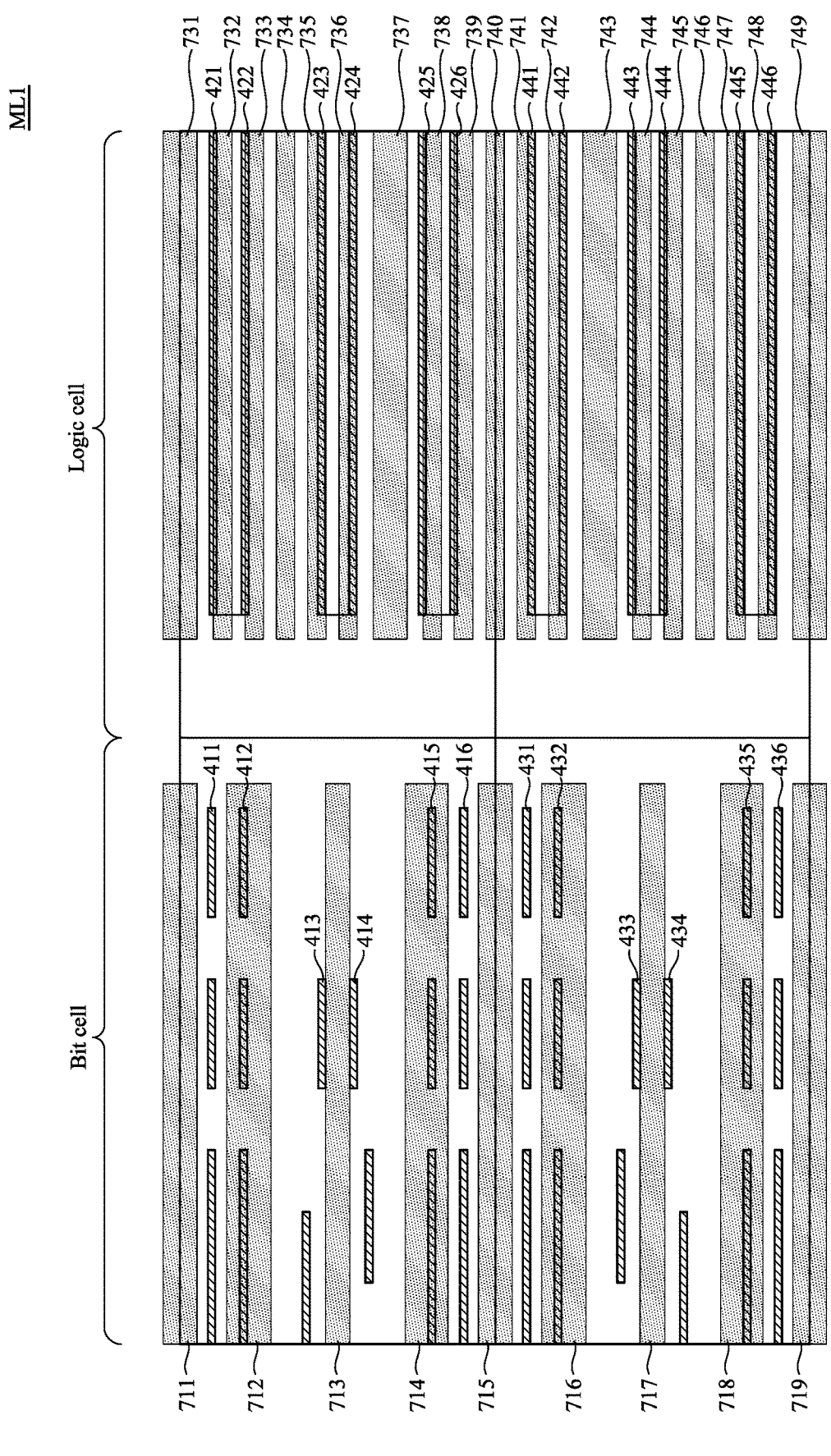
FIGS. 7A-7B are layout diagrams of the memory device shown in FIG. 3, in accordance with some embodiments of the present disclosure.
Figure 7B:
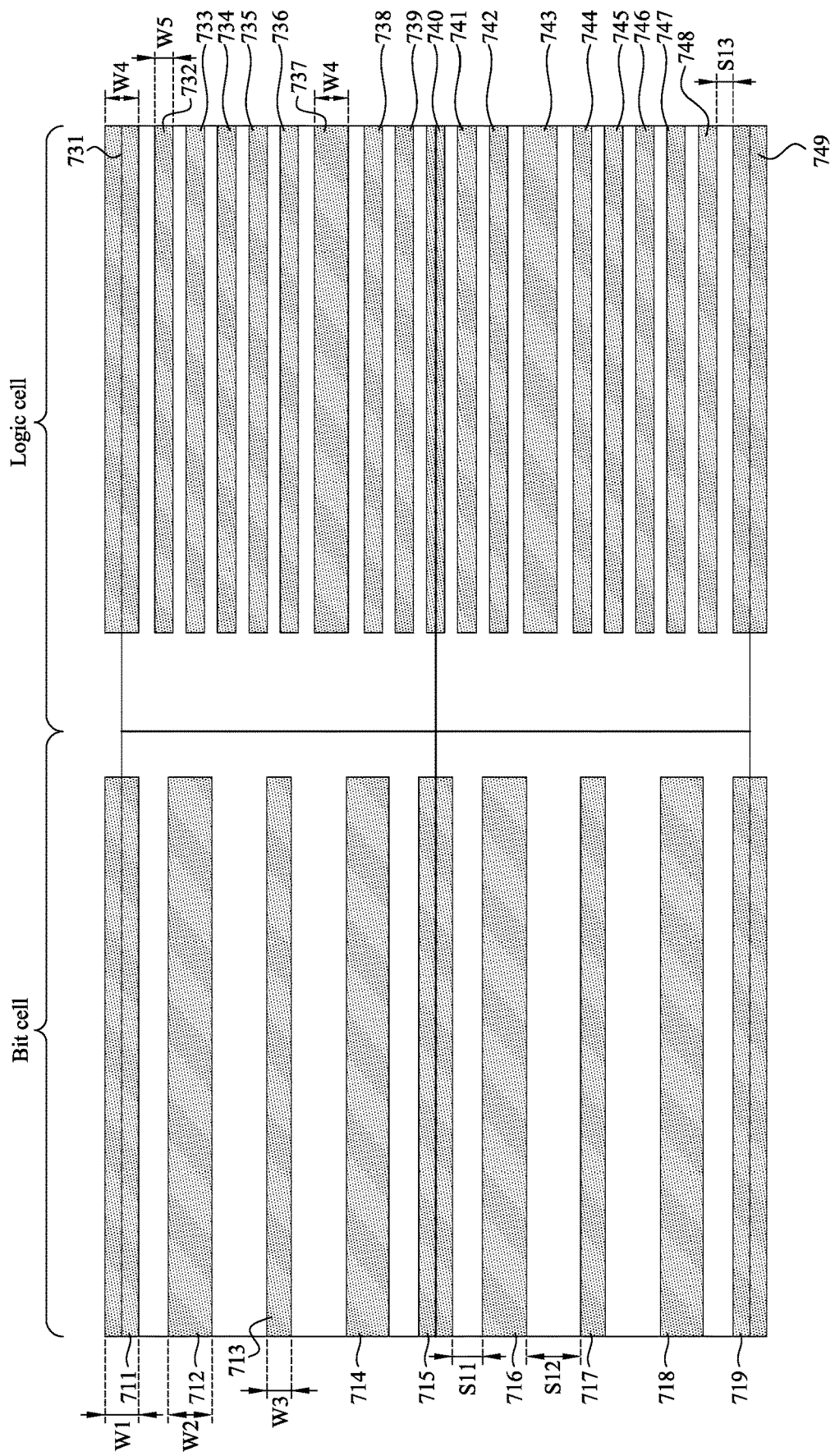

Reference now made to FIGS. 7A-7B. Each of FIGS. 7A-7B is a layout diagram ML1 of the memory device MC1 shown in FIG. 3, in accordance with some embodiments of the present disclosure. In some embodiments, the layout diagram ML1 shown in FIGS. 7A-7B are alternative embodiments of the layout diagram ML1 shown in FIG. 4 or FIGS. 6A-6B. With respect to the embodiments of FIGS. 3, 4, 6A and 6B, like elements in FIGS. 7A-7B are designated with the same reference numbers for ease of understanding. For simplicity, with respect to the embodiments of FIGS. 3, 4, 6A and 6B, some of elements in FIGS. 7A-7B are not labeled with identical elements for ease of understanding.

Compared to the embodiments illustrated in FIG. 4, the layout diagram ML1 further includes conductive rails disposed in a metal-zero (M0) layer, and the M0 layer is disposed above the fins FN. The conductive rails include power rails 711, 713, 715, 717 and 719, and signal rails 712, 714, 716 and 718 disposed in the bit cells, and also includes power rails 731, 737, 743 and 749, and signal rails 732, 733, 734, 735, 736, 738, 739, 740, 741, 742, 744, 745, 746, 747 and 748 disposed in the logic cells. For simplicity, each of the power rails 711, 713, 715, 717, 719, 731, 737, 743 and 749 is referenced as PG hereinafter for illustration, because each of the power rails 711, 713, 715, 717, 719, 731, 737, 743 and 749 operates in a similar way in some embodiments. For simplicity, each of the signal rails 732, 733, 734, 735, 736, 738, 739, 740, 741, 742, 744, 745, 746, 747 and 748 is referenced as SL hereinafter for illustration, because each of the signal rails 732, 733, 734, 735, 736, 738, 739, 740, 741, 742, 744, 745, 746, 747 and 748 operates in a similar way in some embodiments.

With references to FIGS. 7A-7B, the power rails PG in the bit cells or in the logic cells are separated to each other along the columns. The signal rails SL in the bit cells or in the logic cells are disposed between the power rails PG and separated from each other along the columns. Both of the power rails PG and the signal rails SL are parallel to each other, and extend along rows.

In some embodiments, the power rails PG and the signal rails SL in the bit cells are separated from each other evenly. Alternatively stated, in the bit cells, a distance between any two adjacent rails of the power rails PG and the signal rails SL is same from the others. For example, with reference to FIGS. 7A-7B, a distance between the power rail 711 and the signal rail 712 is equal to a distance between including, the signal rail 712 and the power rail 713, and the power rail 713 and the signal rail 714, and so on. In some other embodiments, in the bit cells, at least one distance between the power rails PG and the signal rails SL is different from the others thereof. For example, with reference to FIGS. 7A-7B, a distance between the power rail 711 and the signal rail 712, or between the signal rail 714 and the power rail 715, or between the power rail 715 and the signal rail 716, or between the signal rail 718 and the power rail 719, is equal to a first rail spacing. A distance between the signal rail 712 and the power rail 713, or between the power rail 713 and the signal rail 714, or between the signal rail 716 and the power rail 717, or between the power rail 717 and the signal rail 718, is equal to a second rail spacing. The first rail spacing is also indicated as a distance S11 shown in FIG. 7B, and the second rail spacing is indicated as a distance S12 shown in FIG. 7B. The first rail spacing is different from the second rail spacing.

In some embodiments, the power rails PG and the signal rails SL in the logic cells are separated from each other evenly. Alternatively stated, in the logic cells, a distance between any two adjacent rails of the power rails PG and the signal rails SL is same from the others. For example, with reference to FIGS. 7A-7B, a distance between the power rail 731 and the signal rail 732 is equal to a distance between including, the signal rails 732 and 733, the signal rails 733 and 734, the signal rails 734 and 735, the signal rails 735 and 736, and the signal rail 736 and the power rail 737, and so on. This distance between two adjacent rails of the power rails PG and the signal rails SL is also indicated as a distance S13 shown in FIG. 7B. In some other embodiments, in the bit cells, at least one distance between the power rails PG and the signal rails SL is different from the others of the same. For example, with reference to FIGS. 7A-7B, a distance between the power rail 731 and the signal rail 732 is equal to a third rail spacing, and a distance between the signal rails 732 and 733 is equal to a fourth rail spacing. The third rail spacing is different from the fourth rail spacing.

For illustration in FIG. 7A, in the bit cells, the power rail 711 is directly disposed over a top edge of the bit cells in a layout view. The power rail 715 is directly disposed over an intersected edge between two adjacent bit cells and the power rail 719 is directly disposed over a bottom edge of the bit cells, in a layout view. The signal rail 712 is disposed between the power rails 711 and 713. The signal rail 712 is also disposed over the fins FN including the fin 412. Furthermore, the signal rail 714 is disposed between the power rails 713 and 715. The signal rail 714 is also disposed over the fins FN including the fin 415. Moreover, the signal rail 716 is disposed between the power rails 715 and 717. The signal rail 716 is also disposed over the fins FN including the fin 432. The signal rail 718 is disposed between the power rails 717 and 719. The signal rail 718 is also disposed over the fins FN including the fin 435.

In some embodiments, the power rail 711 is coupled through vias (not shown) to transistors formed in the fins FN including the fin 411. The signal rail 712 is coupled through vias to transistors formed in the fins FN including the fins 411 and 412. The power rail 713 is coupled through vias to transistors formed in the fins FN including the fins 413 and 414. The signal rail 714 is coupled through vias to transistors formed in the fins FN including the fins 415 and 416. The power rail 715 is coupled through vias to transistors formed in the fins FN including the fins 416 and 431. The signal rail 716 is coupled through vias to transistors formed in the fins FN including the fins 431 and 432. The power rail 717 is coupled through vias to transistors formed in the fins FN including the fins 433 and 434. The signal rail 718 is coupled through vias to transistors formed in the fins FN including the fins 435 and 436. The power rail 719 is coupled through vias to transistors formed in the fins FN including the fin 436.

With continued reference to FIG. 7A, in the logic cells, the power rail 731 is directly disposed over a top edge of the logic cells, and the power rail 749 is directly disposed over a bottom edge of the logic cells in a layout view. The signal rail 732 is partially disposed over the fin 421. Alternatively stated, the signal rail 732 is partially overlapped with the fin 421 in a layout view. Furthermore, the signal rail 733 is directly overlapped with the fin 422 in a layout view. The signal rail 734 is not overlapped with the fins FN. Alternatively stated, the signal rail 734 is separated from the fin 422 of one group (i.e., the group T1 shown in FIG. 4) and the fin 423 of another adjacent group (i.e., the group T2 shown in FIG. 4). The signal rail 735 is directly overlapped with the fin 423 in a layout view. The signal rail 736 is substantially overlapped with the fin 424 completely in a layout view. Alternatively stated, the signal rail 736 is substantially disposed over the fin 424. Moreover, the power rail 737 is not overlapped with the fins FN. Alternatively stated, the power rail 737 is separated from the fin 424 of one group (i.e., the group T2 shown in FIG. 4) and the fin 425 of another adjacent group (i.e., the group T3 shown in FIG. 4).

In some embodiments, the power rail 731, the signal rails 732, 733, 734, 735 and 736, and the power rail 737 are indicated as one group of conductive rails for providing signals to one device unit (i.e., the device unit DU1 shown in FIG. 4). In some other embodiments, the power rail 731 is coupled through vias (not shown) to transistors formed in the fins 421 and 422, and the power rail 737 is coupled through vias (not shown) to transistors formed in the fins 423 and 424. Alternatively stated, the power rails 731 and 737 are coupled to a device unit including two transistors of different types formed in the adjacent fins FN, including the fins 421, 422, 423 and 424. In various embodiments, the signal rails 732, 733, 734, 735 and 736 are coupled through vias (not shown) to transistors formed in the fins 421, 422, 423 and 424. Alternatively stated, the signal rails 732, 733, 734, 735 and 736 are coupled to a device unit that is further coupled to the power rails 731 and 737.

Furthermore, the signal rail 738 is partially overlapped with the fin 425 in a layout view. The signal rail 739 is substantially disposed over the fin 426. The signal rail 740 is directly disposed over an intersected edge between two adjacent logic cells. The signal rail 741 is directly overlapped with the fin 441 in a layout view. The signal rail 742 is directly overlapped with the fin 442 in a layout view. Moreover, the power rail 743 is not overlapped with the fins FN. Alternatively stated, the power rail 743 is separated from the fin 442 of one group (i.e., the group T4 shown in FIG. 4) and the fin 443 of another adjacent group (i.e., the group T5 shown in FIG. 4).

In some embodiments, the power rail 737, the signal rails 738, 739, 740, 741 and 742, and the power rail 743 are indicated as one group of conductive rails for providing signals to one device unit (i.e., the device unit DU2 shown in FIG. 4). In some other embodiments, the power rail 737 is coupled through vias (not shown) to transistors formed in the fins 425 and 426, and the power rail 743 is coupled through vias (not shown) to transistors formed in the fins 441 and 442. Alternatively stated, the power rails 737 and 743 are coupled to a device unit including two transistors of different types formed in the adjacent fins FN, including the fins 425, 426, 441 and 442. In various embodiments, the signal rails 738, 739, 740, 741 and 742 are coupled through vias (not shown) to transistors formed in the fins 425, 426, 441 and 442. Alternatively stated, the signal rails 738, 739, 740, 741 and 742 are coupled to a device unit that is further coupled to the power rails 737 and 743.

Moreover, the signal rail 744 is partially overlapped with the fin 443 in a layout view. The signal rail 745 is substantially disposed over the fin 444. The signal rail 746 is not overlapped with the fins FN. Alternatively stated, the signal rail 746 is separated from the fin 444 of one group (i.e., the group T5 shown in FIG. 4) and the fin 445 of another adjacent group (i.e., the group T6 shown in FIG. 4). The signal rail 747 is directly overlapped with the fin 445 in a layout view. The signal rail 748 is directly overlapped with the fin 446 in a layout view.

In some embodiments, the power rail 743, the signal rails 744, 745, 746, 747 and 748, and the power rail 749 are indicated as one group of conductive rails for providing signals to one device unit (i.e., the device unit DU3 shown in FIG. 4). In some other embodiments, the power rail 743 is coupled through vias (not shown) to transistors formed in the fins 443 and 444, and the power rail 749 is coupled through vias (not shown) to transistors formed in the fins 445 and 446. Alternatively stated, the power rails 743 and 749 are coupled to a device unit including two transistors of different types formed in the adjacent fins FN, including the fins 443, 444, 445 and 446. In various embodiments, the signal rails 738, 739, 740, 741 and 742 are coupled through vias (not shown) to transistors formed in the fins 443, 444, 445 and 446. Alternatively stated, the signal rails 744, 745, 746, 747 and 748 are coupled to a device unit that is further coupled to the power rails 743 and 749.

In some embodiments, the power rails PG is made of metal. In some other embodiments, the power rails PG is coupled through vias (not shown) to at least one power circuit (not shown, e.g., a current source or a voltage source) disposed in a metal layer (e.g., metal-one (M1) layer) above the M0 layer, for receiving power signals. In various embodiments, the power rails PG are coupled through vias, disposed between the fins FN and the M0 layer, to the fins FN disposed below the M0 layer, for providing the power signals to the corresponding transistors formed in the fins FN. In some embodiments, at least one power rail PG is configured to provide signals with a first voltage, and at least one power rail PG is configured to provide signals with a second voltage, wherein the first voltage is higher than the second voltage. This power rail PG with the first voltage is indicated as a power line, and this power rail with the second voltage is indicated as a ground line. For example, in some embodiments, with reference to FIG. 7A, the power rails 713 and 717 in the bit cells and the power rails 731 and 743 in the logic cells are referred to as the power lines. The power rails 711, 715 and 719 in the bit cells and the power rails 737 and 749 in the logic cells are referred to as the ground lines. The power lines and the ground lines are disposed intersected to each other.

In some embodiments, the signal rails SL is made of metal. In some other embodiments, the signal rails SL are coupled through vias (not shown) to at least one data circuit (not shown) disposed in the M1 layer, for receiving data signals. In various embodiments, the signal rails SL are coupled through vias (not shown) to the fins FN, for providing the data signals to the corresponding transistors formed in the fins FN.

In some embodiments, the signal rails SL in the bit cells are configured to provide signals with bit data, and these signal rails SL are indicated as bit lines. For example, in some embodiments, with reference to FIG. 7A, the signal rails 712, 714, 716 and 718 in the bit cells are referred to as bit lines. Each of the signal rails 712, 714, 716 and 718 are disposed between one of the power rails 713 and 717 as power metal rails and one of the power rails 711, 715 and 719 as ground rails. In some embodiments, the signal rails 712 and 714 are a bit line pair that is coupled to one row of the memory device (which is the memory device MC1 in FIG. 4). Similarly, the signal rails 716 and 718 are another bit line pair that is coupled to another row of the memory device (which is the memory device MC1 in FIG. 4).

In some embodiments, the signal rails SL in the logic cells are configured to provide signals for operating logic functions, and these signal rails SL are indicated as signal lines. For example, in some embodiments, with reference to FIG. 7A, the signal rails 732, 733, 734, 735 and 736 disposed between one of the power rails 731 as power metal rail and the same 737 as ground rail in the logic cells are referred to as signal lines. Similarly, the signal rails 738, 739, 740, 741 and 742 in the logic cells are referred to as signal lines, and these signal lines are disposed between one of power rails 737 as ground line and the same 743 as power line. The signal rails 744, 745, 746, 747 and 748 in the logic cells are referred to as signal lines, and these signal lines are disposed between one of power rails 743 as power line and the same 749 as ground line.

With reference to FIG. 7B, it only illustrates elements disposed in the M0 layer shown in FIG. 7A for simplicity. A width of one of the power rails PG in the bit cells is indicated as a width W1. A width of one of the signal rails SL in the bit cells is indicated as a width W2. A width of another one of the power rails PG in the bit cells is indicated as a width W3. A width of one of the power rails PG in the logic cells is indicated as a width W4. A width of one of the signal rails SL in the logic cells is indicated as a width W5. For simplicity, only few power rails PG or signal rails SL are labeled with widths W1-W5 illustrated in FIG. 7B.

In some embodiments, with reference to FIG. 7B, in the bit cells, the power rails 711, 715 and 719 are indicated as the ground lines and each of which has the width W1. In the bit cells, the power rails 713 and 717 are indicated as the power lines and each of which has the width W2. In the bit cells, the signal rails 712, 714, 716 and 718 are indicated as the bit lines and each of which has the width W3.

In some embodiments, with reference to FIG. 7B, in the logic cells, the power rails 731 and 743 are indicated as the power lines and each of which has the width W4. In logic cells, the power rails 737 and 749 are indicated as ground lines and each of which also has the width W4. In logic cells, the signal rails 732, 733, 734, 735, 736, 738, 739, 740, 741, 742, 744, 745, 746, 747 and 748 are indicated as the signal lines and each of which has the width W5.

In some embodiments, the widths W1-W5 are different from one another. In some other embodiments, the width W1 is substantially equal to the width W2 or the width W4. In various embodiments, the width W1 is smaller than or larger than the width W2, and the width W1 is smaller than or larger than the width W4. In some embodiments, the width W4 is larger than the width W5.

In some embodiments, the width W4 is larger than a width of the fins FN. The width of the fins FN is also referred to as the fin width P shown in FIGS. 4 and 6A. In various embodiments, the width W5 is larger than the fin width P. In alternative embodiments, the width W5 is substantially equal to fin width P. In some embodiments, the width W4 is smaller than or equal to a distance between two adjacent groups TN in the logic cells (e.g., between the group T1 and T2 shown in FIG. 4). In some other embodiments, the width W4 is substantially equal to a distance between two adjacent groups TN in the logic cells. In various embodiments, the width W5 is smaller than a distance between two adjacent groups TN in the logic cells.

Figure 8A:
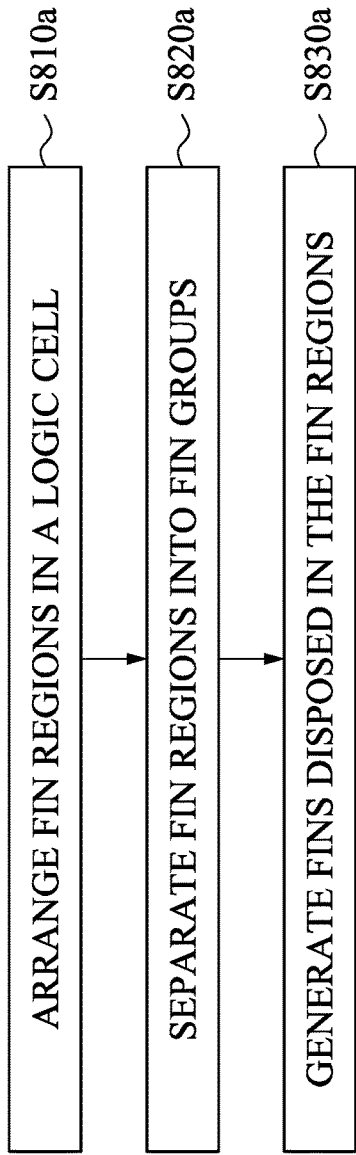
FIG. 8A is a flow chart of a method for generating an integrated circuit (IC) layout diagram including a memory device, in accordance with some embodiments of the present disclosure.

Reference now made to FIG. 8A. FIG. 8A is a flow chart of a method 800A for generating an integrated circuit (IC) layout diagram of the memory device MC0 shown in FIG. 2 or the memory device MC1 shown in FIG. 3, in accordance with some embodiments of the present disclosure. In some embodiments, the layout diagram generated by the method 800A corresponds to the layout diagram ML1 shown in FIGS. 4, 6A-6B or 7A-7B. In some other embodiments, the layout diagram generated by the method 800A corresponds to the layout diagram ML2 shown in FIG. 5. For illustration in FIG. 8A, the method 800A includes operations S810a, S820a, and S830a. Following illustrations of the method 800A in FIG. 8A with reference to the layout diagram in FIG. 4 or 6A-6B include exemplary operations. However, the operations in FIG. 8A are not necessarily performed in the order shown. Alternatively stated, operations may be added, replaced, changed order, and/or eliminated as appropriate, in accordance with the spirit and scope of various embodiments of the present disclosure.

In operation S810a, fin regions, which are separated from each other and extend along rows, are arranged in a logic cell. The logic cell is disposed next to a memory cell, and both of the logic cell and the memory cell are included in a memory device. For illustration, as shown in FIG. 3, the active regions AA1-AA3, which are separated from each other and extend along rows, are arranged in the logic cells 320 and 340 that are disposed next to the bit cells 310 and 330 included in the memory device MC1.

In some embodiments, the method 800A further includes the following operations. A distance between two adjacent fins is determined. For illustration, as shown in FIG. 6A, a distance between two adjacent fins FN in the group T1 is determined to be the distance S3. In some other embodiments, a distance between two adjacent fins is determined based on fin grids in a layout view, and each of the fin grids is separated from one another by the fin pitch. For further illustration, as shown in FIG. 6A, the distance S3 is determined based on the fin grids FN', and each of the fin grids FN' is separated from one another by the fin pitch.

In operation S820a, the fin regions are separated into fin groups. Alternatively stated, the fin regions are grouped or split into several groups that are arranged in rows. For illustration, as shown in FIG. 3, the active regions AA1-AA3 are separated into groups T1-T6, for generating respective transistors.

In operation S830a, fins disposed in the fin regions are generated. The fins of corresponding transistors are constructed in the fin regions. Therefore, the transistors are further generated based on the arrangement of the fin regions. For illustration, as shown in FIG. 3, the fins 321-326 and 341-346 are generated in the active regions AA1-AA3 correspondingly.

In some embodiments, the method 800A further includes the following operations. In the logic cell, the conductive rails including power rails and signal rails are arranged in a metal layer above the fin regions. In the logic cell, the power rails are separated from the fins in a layout view. For illustration, as shown in FIG. 7A, in the logic cells, the conductive rails including power rails PG and signal rails SL are arranged in the M0 layer above the active regions. Also illustrated in FIG. 7A, in the logic cell, the power rails PG are separated from the fins FN in a layout view.

In some embodiments, the method 800A further includes the following operations. In the logic cell, at least one of the signal rails is partially overlapped with the fins in a layout view. For illustration, as shown in FIG. 7A, in the logic cells, at least one of the signal rails SL, for example, including the signal rail 732, is partially overlapped with the fins FN in a layout view.

Figure 8B:
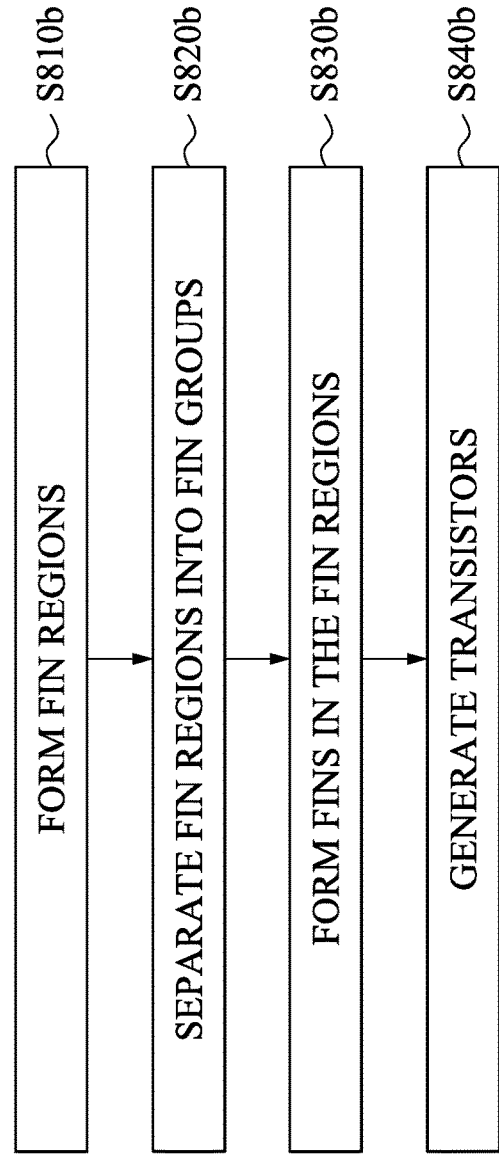
FIG. 8B is a flow chart of a method for generating an integrated circuit (IC) of a memory device, in accordance with some embodiments of the present disclosure.

FIG. 8B is a flow chart of a method 800B for fabricating an integrated circuit (IC) including the memory device MC0 shown in FIG. 2 or the memory device MC1 shown in FIG. 3, in accordance with some embodiments of the present disclosure. For illustration in FIG. 8B, the method 800B includes operations S810b, S820b, S830b and S840b. Following illustrations of the method 800B in FIG. 8B with reference to the memory device and the layout diagrams thereof in FIGS. 4, 6A-6B or 7A-7B include exemplary operations. However, the operations in FIG. 8B are not necessarily performed in the order shown. Alternatively stated, operations may be added, replaced, changed order, and/or eliminated as appropriate, in accordance with the spirit and scope of various embodiments of the present disclosure.

In operation S810b, fin regions are formed in a logic cell that is disposed next to a bit cell. The fin regions are separated from each other and extend along a row direction. In some embodiments, the fin regions correspond to the active regions AA1-AA3 shown in FIG. 3. In some embodiments, the logic cell corresponds to the logic cell 320 or 340 shown in FIG. 3, and the bit cell corresponds to the bit cell 310 or 330 shown in FIG. 3.

In operation S820b, the fin regions are separated into fin groups. In some embodiments, fin groups correspond to the groups T1-T6 shown in FIG. 3. In some embodiments, a distance between at least two adjacent fin groups is different from a distance between another two adjacent fin groups.

In operation S830b, fins are formed in the fin regions. In some embodiments, the fins correspond to the fins 321-326 or 341-346 shown in FIG. 3. In some embodiments, a distance between the fins is greater than or equal to the fin pitch.

In operation S840b, transistors are generated. The transistors include the fins that are formed in the operation S830b. In some embodiments, the transistors correspond to the transistors T1-T6 shown in FIG. 3.

Figure 9:
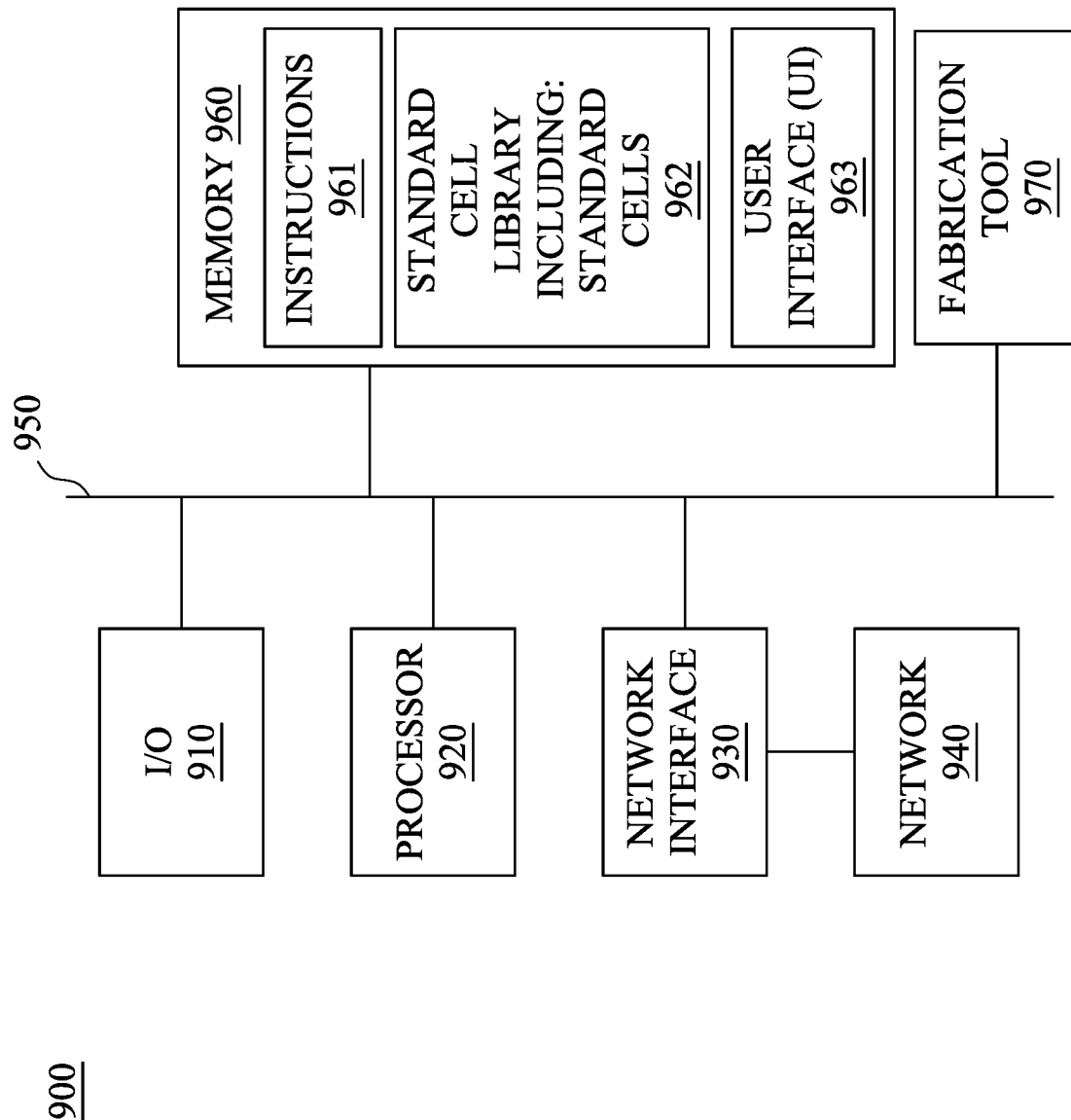
FIG. 9 is a block diagram of a system for designing an IC layout design, in accordance with some embodiments of the present disclosure.

Reference is now made to FIG. 9. FIG. 9 is a block diagram of electronic design automation (EDA) system 900 for designing the integrated circuit layout design, in accordance with some embodiments of the present disclosure. EDA system 900 is configured to implement one or more operations of the method 800 disclosed in FIG. 8A or the method 800B disclosed in FIG. 8B, and further explained in conjunction with FIGS. 3-4, 6A-6B and 7A-7B. In some embodiments, EDA system 900 includes an APR system.

In some embodiments, EDA system 900 is a general purpose computing device including a hardware processor 920 and a non-transitory, computer-readable storage medium 960. Storage medium 960, amongst other things, is encoded with, i.e., stores, computer program code (instructions) 961, i.e., a set of executable instructions. Execution of instructions 961 by hardware processor 920 represents (at least in part) an EDA tool which implements a portion or all of, e.g., the method 800A or 800B.

The processor 920 is electrically coupled to computer-readable storage medium 960 via a bus 950. The processor 920 is also electrically coupled to an I/O interface 910 and a fabrication tool 970 by bus 950. A network interface 930 is also electrically connected to processor 920 via bus 950. Network interface 930 is connected to a network 940, so that processor 920 and computer-readable storage medium 960 are capable of connecting to external elements via network 940. The processor 920 is configured to execute computer program code 961 encoded in computer-readable storage medium 960 in order to cause EDA system 900 to be usable for performing a portion or all of the noted processes and/or methods. In one or more embodiments, processor 920 is a central processing unit (CPU), a multi-processor, a distributed processing system, an application specific integrated circuit (ASIC), and/or a suitable processing unit.

In one or more embodiments, computer-readable storage medium 960 is an electronic, magnetic, optical, electromagnetic, infrared, and/or a semiconductor system (or apparatus or device). For example, computer-readable storage medium 960 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 960 includes a compact disk-read only memory (CD-ROM), a compact disk-read/write (CD-R/W), and/or a digital video disc (DVD).

In one or more embodiments, storage medium 960 stores computer program code 961 configured to cause EDA system 900 (where such execution represents (at least in part) the EDA tool) to be usable for performing a portion or all of the noted processes and/or methods. In one or more embodiments, storage medium 960 also stores information which facilitates performing a portion or all of the noted processes and/or methods. In one or more embodiments, storage medium 960 stores library 962 of standard cells including such standard cells as disclosed herein, for example, a memory cell included in the array of cells 410-440 discussed above with respect to FIG. 4.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 920.

EDA system 900 also includes network interface 930 coupled to processor 920. Network interface 930 allows EDA system 900 to communicate with network 940, to which one or more other computer systems are connected. Network interface 930 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 900.

EDA system 900 also includes the fabrication tool 970 coupled to the processor 920. The fabrication tool 970 is configured to fabricate integrated circuits, including, for example, the memory device MC0 or MC1 implemented by a semiconductor device 100 illustrated in FIG. 1, based on the design files processed by the processor 920 and/or the IC layout designs as discussed above.

EDA system 900 is configured to receive information through I/O interface 910. The information received through I/O interface 910 includes one or more of instructions, data, design rules, libraries of standard cells, and/or other parameters for processing by processor 920. The information is transferred to processor 920 via bus 950. EDA system 900 is configured to receive information related to a UI through I/O interface 910. The information is stored in computer-readable medium 960 as user interface (UI) 963.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 10:
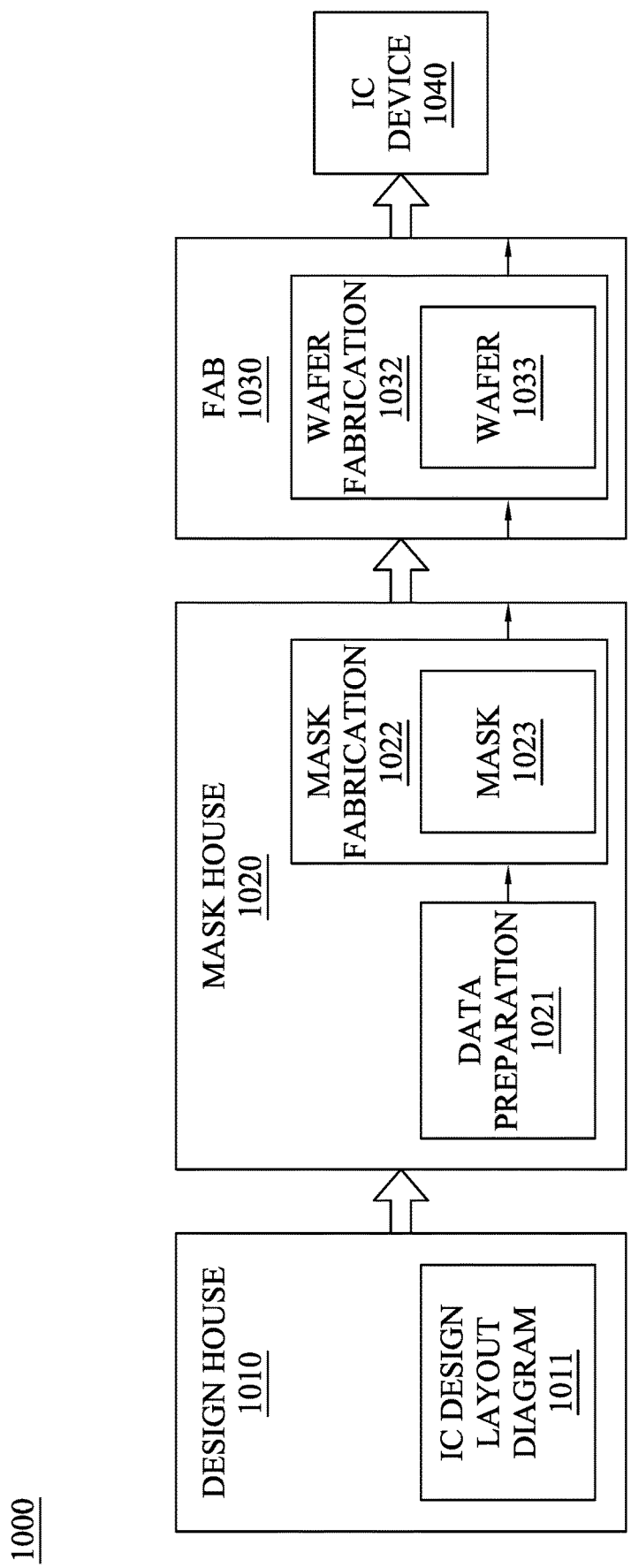
FIG. 10 is a block diagram of an integrated circuit (IC) manufacturing system, and an IC manufacturing flow associated therewith, in accordance with some embodiments of the present disclosure.

FIG. 10 is a block diagram of IC manufacturing system 1000, and an IC manufacturing flow associated therewith, in accordance with some embodiments of the present disclosure. In some embodiments, based on a layout diagram, at least one of (A) one or more semiconductor masks or (B) at least one component in a layer of a semiconductor integrated circuit is fabricated using IC manufacturing system 1000.

In FIG. 10, IC manufacturing system 1000 includes entities, such as a design house 1010, a mask house 1020, and an IC manufacturer/fabricator ("fab") 1030, that interact with one another in the design, development, and manufacturing cycles and/or services related to manufacturing an IC device 1040. The entities in IC manufacturing system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1010, mask house 1020, and IC fab 1030 is owned by a single larger company. In some embodiments, two or more of design house 1010, mask house 1020, and IC fab 1030 coexist in a common facility and use common resources.

Design house (or design team) 1010 generates an IC design layout diagram 1011. IC design layout diagram 1011 includes various geometrical patterns, for example, an IC layout design depicted in FIGS. 4, 5, 6A-6B and/or FIG. 7A-7B, designed for an IC device 1040, for example, memory device MC1, discussed above with respect to FIG. 3. The geometrical patterns correspond to patterns of metal, oxide, or semiconductor layers that make up the various components of IC device 1040 to be fabricated. The various layers combine to form various IC features. For example, a portion of IC design layout diagram 1011 includes various IC features, such as an fin, gate electrode, source and drain, conductive segments or vias of an interlayer interconnection, to be formed in a semiconductor substrate (such as a silicon wafer) and various material layers disposed on the semiconductor substrate. Design house 1010 implements a proper design procedure to form IC design layout diagram 1011. The design procedure includes one or more of logic design, physical design or place and route. IC design layout diagram 1011 is presented in one or more data files having information of the geometrical patterns. For example, IC design layout diagram 1011 can be expressed in a GDSII file format or DFII file format.

Mask house 1020 includes mask data preparation 1021 and mask fabrication 1022. Mask house 1020 uses IC design layout diagram 1011 to manufacture one or more masks 1023 to be used for fabricating the various layers of IC device 1040 according to IC design layout diagram 1011. Mask house 1020 performs mask data preparation 1021, where IC design layout diagram 1011 is translated into a representative data file ("RDF"). Mask data preparation 1021 provides the RDF to mask fabrication 1022. Mask fabrication 1022 includes a mask writer. A mask writer converts the RDF to an image on a substrate, such as a mask (reticle) 1023 or a semiconductor wafer 1033. The IC design layout diagram 1011 is manipulated by mask data preparation 1021 to comply with particular characteristics of the mask writer and/or requirements of IC fab 1030. In FIG. 10, data preparation 1021 and mask fabrication 1022 are illustrated as separate elements. In some embodiments, data preparation 1021 and mask fabrication 1022 can be collectively referred to as mask data preparation.

In some embodiments, mask data preparation 1021 includes optical proximity correction (OPC) which uses lithography enhancement techniques to compensate for image errors, such as those that can arise from diffraction, interference, other process effects and the like. OPC adjusts IC design layout diagram 1011. In some embodiments, data preparation 1021 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1021 includes a mask rule checker (MRC) that checks the IC design layout diagram 1011 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1011 to compensate for limitations during mask fabrication 1022, which may undo part of the modifications performed by OPC in order to meet mask creation rules.

In some embodiments, data preparation 1021 includes lithography process checking (LPC) that simulates processing that will be implemented by IC fab 1030 to fabricate IC device 1040. LPC simulates this processing based on IC design layout diagram 1011 to create a simulated manufactured device, such as IC device 1040. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1011.

It should be understood that the above description of data preparation 1021 has been simplified for the purposes of clarity. In some embodiments, data preparation 1021 includes additional features such as a logic operation (LOP) to modify the IC design layout diagram 1011 according to manufacturing rules. Additionally, the processes applied to IC design layout diagram 1011 during data preparation 1021 may be executed in a variety of different orders.

After data preparation 1021 and during mask fabrication 1022, a mask 1023 or a group of masks 1023 are fabricated based on the modified IC design layout diagram 1011. In some embodiments, mask fabrication 1022 includes performing one or more lithographic exposures based on IC design layout diagram 1011. In some embodiments, an electron-beam (e-beam) or a mechanism of multiple e-beams is used to form a pattern on a mask (photomask or reticle) 1023 based on the modified IC design layout diagram 1011. Mask 1023 can be formed in various technologies. In some embodiments, mask 1023 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1023 includes a transparent substrate (for example, fused quartz) and an opaque material (for example, chromium) coated in the opaque regions of the binary mask. In another example, mask 1023 is formed using a phase shift technology. In a phase shift mask (PSM) version of mask 1023, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1022 is used in a variety of processes. For example, such a mask(s) is used in an ion implantation process to form various doped regions in semiconductor wafer 1033, in an etching process to form various etching regions in semiconductor wafer 1033, and/or in other suitable processes.

IC fab 1030 includes wafer fabrication 1032. IC fab 1030 is an IC fabrication business that includes one or more manufacturing facilities for the fabrication of a variety of different IC products. In some embodiments, IC fab 1030 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1030 uses mask(s) 1023 fabricated by mask house 1020 to fabricate IC device 1040. Thus, IC fab 1030 at least indirectly uses IC design layout diagram 1011 to fabricate IC device 1040. In some embodiments, semiconductor wafer 1033 is fabricated by IC fab 1030 using mask(s) 1023 to form IC device 1040. In some embodiments, the IC fabrication includes performing one or more lithographic exposures based at least indirectly on IC design layout diagram 1011. Semiconductor wafer 1033 includes a silicon substrate or other proper substrate having material layers formed thereon. Semiconductor wafer 1033 further includes one or more of various doped regions, dielectric features, multi-level interconnects, and the like (formed at subsequent manufacturing steps).

Also disclosed is a method including: abutting a first logic cell having a first cell height to a first memory cell having the first cell height; forming a first conductive rail and a second conductive rail at opposite sides of the first memory cell, respectively; forming a plurality of first conductive rails between the first conductive rail and the second conductive rail; forming a third conductive rail and a fourth conductive rail at opposite sides of the first logic cell, respectively; and forming a plurality of second conductive rails between the third conductive rail and the fourth conductive rail. An amount of the plurality of second conductive rails is larger than an amount of the plurality of first conductive rails.

Also disclosed is a method including: abutting a first logic cell to a first memory cell and a second logic cell having a first height; abutting a second memory cell having the first height to the first memory cell and the second logic cell; forming a first fin group in the first logic cell; forming a second fin group, a third fin group and a fourth fin group in the second logic cell; and forming a first transistor, a second transistor, a third transistor and a fourth transistor by the first fin group, the second fin group, the third fin group and the fourth fin group, respectively. The first transistor and the second transistor are adjacent with each other, and the third transistor and the fourth transistor are adjacent with each other.

Also disclosed is a method including: aligning a first logic cell with a first memory cell; and aligning each of a first fin of the first logic cell and a second fin of the first memory cell to with a plurality of fin grids. A third fin of the first memory cell is not aligned with the plurality of fin grids.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
abutting a first logic cell having a first cell height to a first memory cell having the first cell height along a first direction;
forming a first conductive rail and a second conductive rail at opposite sides of the first memory cell, respectively;
forming a plurality of first conductive rails between the first conductive rail and the second conductive rail along a second direction perpendicular to the first direction;
forming a third conductive rail and a fourth conductive rail at opposite sides of the first logic cell, respectively;
forming a plurality of second conductive rails between the third conductive rail and the fourth conductive rail; and
forming a first fin elongated along the first direction in the first logic cell,
wherein an amount of the plurality of second conductive rails is larger than an amount of the plurality of first conductive rails, and
the first fin is partially overlapped with the plurality of second conductive rails in a layout view.

2. The method of claim 1, further comprising:
abutting a second logic cell having a second cell height to a second memory cell having the second cell height;
abutting the second logic cell and the second memory cell to the first logic cell and the first memory cell, respectively;
forming a fifth conductive rail and the second conductive rail at opposite sides of the second memory cell, respectively;
forming a plurality of third conductive rails between the fifth conductive rail and the second conductive rail;
forming a sixth conductive rail and the fourth conductive rail at opposite sides of the second logic cell, respectively; and
forming a plurality of fourth conductive rails between the sixth conductive rail and the fourth conductive rail,
wherein an amount of the plurality of fourth conductive rails is larger than an amount of the plurality of third conductive rails.

3. The method of claim 1, further comprising:
forming a second fin and a third fin in the first memory cell;
forming a fourth fin and a fifth fin in the first logic cell;
aligning the second fin and the third fin to the fourth fin and the fifth fin, respectively;
coupling a fifth conductive rail of the plurality of first conductive rails to each of the second fin and the third fin;
disposing a sixth conductive rail of the plurality of second conductive rails over the fourth fin; and
disposing a seventh conductive rail of the plurality of second conductive rails over the fifth fin,
wherein the sixth conductive rail is adjacent to the seventh conductive rail, and
the fourth fin is adjacent to the fifth fin.

4. The method of claim 3, further comprising:
forming a sixth fin in the first memory cell; and
forming a seventh fin and an eighth fin in the first logic cell,
wherein the seventh fin and the eighth fin are adjacent with each other and extend along the first direction, and
the sixth fin is disposed between the seventh fin and the eighth fin along the second direction.

5. The method of claim 4, further comprising:
disposing an eighth conductive rail of the plurality of first conductive rails over the sixth fin;

disposing a ninth conductive rail of the plurality of second conductive rails over the seventh fin; and
disposing a tenth conductive rail of the plurality of second conductive rails over the seventh fin,
wherein the ninth conductive rail and the tenth conductive rail are adjacent with each other, and
the eighth conductive rail is between the fifth conductive rail and the first conductive rail.

6. The method of claim 5, further comprising:
disposing a eleventh conductive rail of between the tenth conductive rail and the sixth conductive rail; and
separating the eleventh conductive rail from each of the eighth fin and the fourth fin.

7. The method of claim 1, further comprising:
forming a second fin in the first logic cell; and
forming a third fin in the first memory cell,
wherein the first fin and the second fin are adjacent with each other and extend along the first direction, and
the third fin is disposed between the first fin and the second fin along the second direction.

8. The method of claim 7, further comprising:
disposing a fifth conductive rail of the plurality of first conductive rails over the third fin;
disposing a sixth conductive rail of the plurality of second conductive rails over the second fin; and
disposing a seventh conductive rail of the plurality of second conductive rails over the third fin,
wherein the sixth conductive rail and the seventh conductive rail are adjacent with each other.

9. A method, comprising:
abutting a first logic cell having a first cell height to a first memory cell having the first cell height;
forming a first conductive rail and a second conductive rail at opposite sides of the first memory cell, respectively;
forming a plurality of first conductive rails between the first conductive rail and the second conductive rail;
forming a third conductive rail and a fourth conductive rail at opposite sides of the first logic cell, respectively;
forming a plurality of second conductive rails between the third conductive rail and the fourth conductive rail;
forming a second logic cell abutted to a second memory cell and abutted to the first logic cell;
forming a fifth conductive rail and the second conductive rail at opposite sides of the second memory cell, respectively;
forming a plurality of third conductive rails between the fifth conductive rail and the second conductive rail;
forming a sixth conductive rail and the fourth conductive rail at opposite sides of the second logic cell, respectively; and
forming a plurality of fourth conductive rails between the sixth conductive rail and the fourth conductive rail,
wherein an amount of the plurality of second conductive rails is larger than an amount of the plurality of first conductive rails,
an amount of the plurality of fourth conductive rails is larger than an amount of the plurality of third conductive rails,
the second memory cell is different from the first memory cell, and
the fifth conductive rail is different from the first conductive rail.

10. The method of claim 9, further comprising:
forming a first fin and a second fin in the first memory cell;
forming a third fin and a fourth fin in the first logic cell;
forming a seventh conductive rail of the plurality of first conductive rails coupled to each of the first fin and the second fin;
forming an eighth conductive rail of the plurality of second conductive rails disposed over the third fin; and
forming a ninth conductive rail of the plurality of second conductive rails disposed over the fourth fin,
wherein the eighth conductive rail is adjacent to the ninth conductive rail,
the first fin and the second fin are aligned to the third fin and the fourth fin, respectively, and
the third fin is adjacent to the fourth fin.

11. The method of claim 10, further comprising:
forming a fifth fin in the first memory cell; and
forming a sixth fin and a seventh fin in the first logic cell,
wherein the sixth fin and the seventh fin are adjacent with each other and extend along a first direction, and
the fifth fin is disposed between the sixth fin and the seventh fin along a second direction different from the first direction.

12. The method of claim 11, further comprising:
forming a tenth conductive rail of the plurality of first conductive rails disposed over the fifth fin;
forming an eleventh conductive rail of the plurality of second conductive rails disposed over the sixth fin; and
forming a twelfth conductive rail of the plurality of second conductive rails disposed over the sixth fin,
wherein the eleventh conductive rail and the twelfth conductive rail are adjacent with each other, and
the tenth conductive rail is between the seventh conductive rail and the first conductive rail.

13. The method of claim 12, further comprising:
forming a thirteenth conductive rail of the plurality of second conductive rails disposed between the twelfth conductive rail and the eighth conductive rail,
wherein the thirteenth conductive rail is separated from each of the seventh fin and the third fin.

14. The method of claim 9, further comprising:
forming a first fin and a second fin in the first logic cell; and
forming a third fin in the first memory cell,
wherein the first fin and the second fin are adjacent with each other and extend along a first direction, and
the third fin is disposed between the first fin and the second fin along a second direction different from the first direction.

15. The method of claim 14, further comprising:
forming a seventh conductive rail of the plurality of first conductive rails disposed over the third fin;
forming a eighth conductive rail of the plurality of second conductive rails disposed over the second fin; and
forming a ninth conductive rail of the plurality of second conductive rails disposed over the third fin,
wherein the eighth conductive rail and the ninth conductive rail are adjacent with each other.

16. A method, comprising:
abutting a first logic cell having a first cell height to a first memory cell having the first cell height;
forming a first conductive rail and a second conductive rail at opposite sides of the first memory cell, respectively;
forming a plurality of first conductive rails between the first conductive rail and the second conductive rail;
forming a third conductive rail and a fourth conductive rail at opposite sides of the first logic cell, respectively;
forming a plurality of second conductive rails between the third conductive rail and the fourth conductive rail;

forming a first fin and a second fin in the first memory cell; and forming a third fin and a fourth fin in the first logic cell;

wherein an amount of the plurality of second conductive rails is larger than an amount of the plurality of first conductive rails, the first fin and the second fin are aligned to the third fin and the fourth fin, respectively, the third fin is adjacent to the fourth fin, the first fin and the second fin are disposed between the first conductive rail and the second conductive rail, and the third fin and the fourth fin are disposed between the third conductive rail and the fourth conductive rail.

17. The method of claim 16, further comprising:

forming a fifth conductive rail of the plurality of first conductive rails coupled to each of the first fin and the second fin.

18. The method of claim 17, further comprising:

forming a fifth fin in the first memory cell; and forming a sixth fin and a seventh fin in the first logic cell, wherein the sixth fin and the seventh fin are adjacent with each other and extend along a first direction, and the fifth fin is disposed between the sixth fin and the seventh fin along a second direction different from the first direction.

19. The method of claim 18, further comprising:

forming a sixth conductive rail of the plurality of first conductive rails disposed over the fifth fin;

forming a seventh conductive rail of the plurality of second conductive rails disposed over the sixth fin; and forming a eighth conductive rail of the plurality of second conductive rails disposed over the sixth fin, wherein the seventh conductive rail and the eighth conductive rail are adjacent with each other, and the sixth conductive rail is between the fifth conductive rail and the first conductive rail.

20. The method of claim 16, further comprising:

forming a fifth fin and a sixth fin in the first logic cell; and forming a seventh fin in the first memory cell, wherein the fifth fin and the sixth fin are adjacent with each other and extend along a first direction, and the seventh fin is disposed between the fifth fin and the sixth fin along a second direction different from the first direction.

* * * * *